United States Patent [19]

Tsai et al.

[11] Patent Number: 5,818,877
[45] Date of Patent: Oct. 6, 1998

[54] METHOD FOR REDUCING STORAGE REQUIREMENTS FOR GROUPED DATA VALUES

[75] Inventors: Min-Jen Tsai, Los Angeles; John D. Villasenor, Santa Monica; Feng Chen, Irvine, all of Calif.

[73] Assignee: The Regents of the University of California, Oakland, Calif.

[21] Appl. No.: 622,659

[22] Filed: Mar. 26, 1996

Related U.S. Application Data

[60] Provisional application No. 60/013,605 Mar. 14, 1996.
[51] Int. Cl.[6] .................................................. H04M 7/46
[52] U.S. Cl. ........................... 375/241; 375/253; 341/55; 341/67; 341/106; 358/261.1; 382/245
[58] Field of Search ................................. 341/50, 51, 52, 341/55, 59, 60, 63, 67, 87, 90, 95, 106, 107; 375/200, 240, 241, 245, 246, 253; 348/405, 384, 409; 382/232, 238, 245; 358/261.1–261.3, 426

[56] References Cited

U.S. PATENT DOCUMENTS

| | | | |
|---|---|---|---|
| 5,381,144 | 1/1995 | Wilson et al. | 341/63 |
| 5,502,744 | 3/1996 | Marshall | 375/259 |
| 5,517,533 | 5/1996 | Szmauz et al. | 375/354 |
| 5,539,401 | 7/1996 | Kumaki et al. | 341/67 |
| 5,561,422 | 10/1996 | Kim | 341/67 |
| 5,602,549 | 2/1997 | Jeong | 341/67 |

*Primary Examiner*—Don N. Vo
*Assistant Examiner*—Amanda T. Le
*Attorney, Agent, or Firm*—Knobbe, Martens, Olson & Bear, LLP

[57] ABSTRACT

A method generates a reduced number of values representing a sequence of grouped data values and partitions the reduced number of values by first mapping data values into groups of symbols and then partitioning the resulting stream of symbols. The digits representing the first data value in each group are replaced with symbols from a first alphabet. The most significant digit of the second data value in each group and the sign of that second data value are also represented by a symbol from the first symbol set, while the remaining significant bits of the second data value in each group are represented by symbols from a second symbol set. A stream of symbols which represent a sequence of grouped data values is partitioned into first partition symbol groups and second partition symbol groups. Each first partition symbol group comprises the symbols representing the first data value in each group and also the symbol representing the least significant bit of the second data value which follows. Each second partition symbol group comprises the symbols representing all digits of a second data value excluding the symbol which represented the least significant digits.

13 Claims, 20 Drawing Sheets

| | SYMBOL MAP 1 (702) | | SYMBOL MAP 2 (704) | |
|---|---|---|---|---|
| ABSOLUTE VALUE OF LEVEL | WORD FOR POSITIVE LEVEL | WORD FOR NEGATIVE LEVEL | WORD FOR POSITIVE LEVEL | WORD FOR NEGATIVE LEVEL |
| 1 | 0+ | 0− | 0+ | 0− |
| 2 | 1+ | 1− | 1+ | 1− |
| 3 | 00+ | 00− | 00+ | 00− |
| 4 | 10+ | 10− | 10+ | 10− |
| 5 | 01+ | 01− | 01+ | 01− |
| 6 | 11+ | 11− | 11+ | 11− |
| 7 | 000+ | 000− | 000+ | 000− |
| 8 | 100+ | 100− | 100+ | 100− |
| 9 | 010+ | 010− | 010+ | 010− |
| 10 | 110+ | 110− | 001+ | 001− |
| 11 | 001+ | 001− | 110+ | 110− |
| 12 | 101+ | 101− | 101+ | 101− |
| 13 | 011+ | 011− | 011+ | 011− |
| 14 | 111+ | 111− | 111+ | 111− |
| 15 | 0000+ | 0000− | 0000+ | 0000− |
| ⋮ | ⋮ | ⋮ | ⋮ | ⋮ |

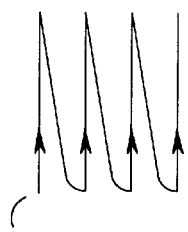
FIG.3C
306 — abcdefghijklmnop
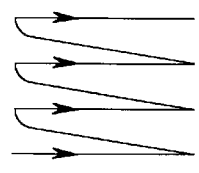
FIG.3E
310 — aeimbfjncgkodhlp
FIG.3G
314 — abeifcdgjmnkhlop
FIG.3B
304 — HORIZONTAL RASTER SCAN
FIG.3D
308 — VERTICAL RASTER SCAN
FIG.3F
312 — ZIG-ZAG SCAN
FIG.3A
| a | b | c | d |
|---|---|---|---|
| e | f | g | h |
| i | j | k | l |
| m | n | o | p |
302 — INPUT DATA ARRAY

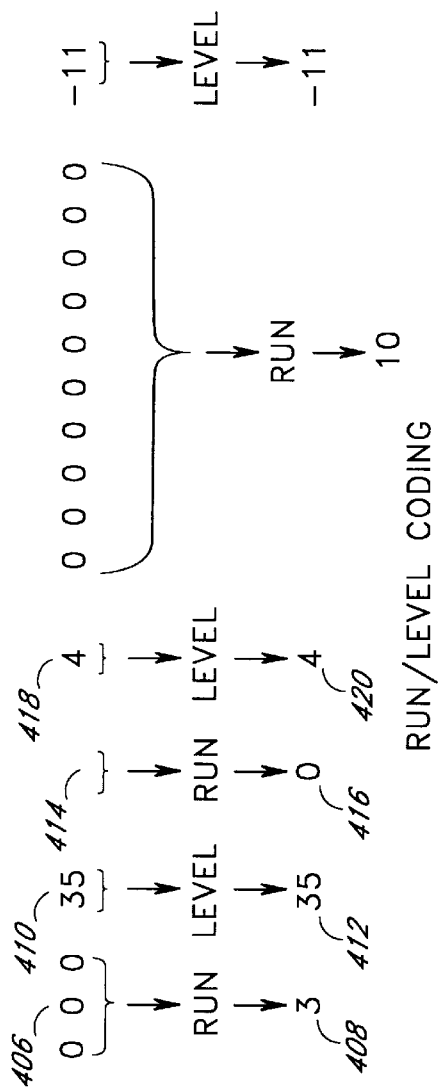

| | SYMBOL MAP 1 | SYMBOL MAP 2 |
|---|---|---|
| RUN VALUE | WORD | WORD |
| 1 | + | + |
| 2 | − | − |
| 3 | ++ | ++ |
| 4 | −− | +− |
| 5 | +− | −+ |
| 6 | −+ | −− |
| 7 | +++ | +++ |
| 8 | −−− | ++− |
| 9 | +−− | +−+ |
| 10 | −+− | −++ |
| 11 | ++− | +−− |
| 12 | −−+ | −+− |
| 13 | +−+ | −−+ |
| 14 | −++ | −−− |
| 15 | ++++ | ++++ |
| 16 | −−−− | +++− |
| ⋮ | ⋮ | ⋮ |

FIG.5

| ABSOLUTE VALUE OF LEVEL | SYMBOL MAP 1 (702) | | SYMBOL MAP 2 (704) | |
|---|---|---|---|---|
| | WORD FOR POSITIVE LEVEL | WORD FOR NEGATIVE LEVEL | WORD FOR POSITIVE LEVEL | WORD FOR NEGATIVE LEVEL |
| 1 | 0+ | 0− | 0+ | 0− |
| 2 | 1+ | 1− | 1+ | 1− |
| 3 | 00+ | 00− | 00+ | 00− |
| 4 | 10+ | 10− | 10+ | 10− |
| 5 | 01+ | 01− | 01+ | 01− |
| 6 | 11+ | 11− | 11+ | 11− |
| 7 | 000+ | 000− | 000+ | 000− |
| 8 | 100+ | 100− | 100+ | 100− |
| 9 | 010+ | 010− | 010+ | 010− |
| 10 | 110+ | 110− | 001+ | 001− |
| 11 | 001+ | 001− | 110+ | 110− |
| 12 | 101+ | 101− | 101+ | 101− |
| 13 | 011+ | 011− | 011+ | 011− |
| 14 | 111+ | 111− | 111+ | 111− |
| 15 | 0000+ | 0000− | 0000+ | 0000− |
| ... | ... | ... | ... | ... |

| 0 | 35 | 0 | 0 |
|---|----|---|---|
| 0 | 4  | 0 | 0 |
| 0 | 0  | 0 | 0 |
| 0 | 0  | 0 | -11 |

1002

INPUT DATA ARRAY

| | RUN/LEVEL OUTPUT |
|---|---|
| RUN   | 3 |
| LEVEL | 35 |
| RUN   | 0 |
| LEVEL | 4 |
| RUN   | 10 |
| LEVEL | -11 |

FIG. 10C

SYMBOLS AFTER MAPPING (LSB—> MSB)

```
+ +
0 0 1 0 0 +
NOT CODED
1 0 +
- + -
0 0 1 -
```

SYMBOL STREAM FROM SYMBOL MAPPER

FIG.20a

| | 2002 | 2004 | 2006 |
|---|---|---|---|
| SEQUENCE OF FLOATING POINT NUMBERS | MANTISSA | | EXPONENT |
| $.32 \times 10^{-3}$ | .32 | | $-3$ |
| $.3419 \times 10^{0}$ | .3419 | | 0 |
| $-.221 \times 10^{4}$ | $-.221$ | | 4 |
| 0 | 0 | | 0 |
| $-.07533 \times 10^{8}$ | $-.07533$ | | 8 |

FIG.20b $.32/(2 \times 10^{23}) = 2684355$
$.3419/(2 \times 10^{23}) = 2868065$
$-.221/(2 \times 10^{23}) = -1853882$
$0/(2 \times 10^{23}) = 0$
$-.07533/(2 \times 10^{23}) = -631914$

QUANTIZATION OF MANTISSA

FIG.20c

| QUANTIZED MANTISSA | EXPONENT |
|---|---|
| 2684355 | $-3$ |
| 2868065 | 0 |
| $-1853882$ | 4 |
| 0 | 0 |
| $-631914$ | 8 |

RUN/LEVEL PAIRS GENERATED BY VERTICAL SCAN

RUN/LEVEL PAIRS GENERATED BY HORIZONTAL SCAN

METHOD FOR REDUCING STORAGE REQUIREMENTS FOR GROUPED DATA VALUES

RELATED APPLICATIONS

Pursuant to 35 U.S.C. § 119(e), this application claims the priority benefit of U.S. Provisional application No. 60/013,605 filed on Mar. 14, 1996.

BACKGROUND OF THE INVENTION

1. Field of the Invention

This invention relates to data compression, and in particular, to compression of run/level coded data or other sequential, digital data.

2. Description of the Prior Art

With improvements in data processing speed, data transmission rates and data storage capacity, it is becoming increasingly more cost effective to manipulate data in digital form. Yet, even with such improvements, the storage requirements for complete digital renderings of many data sources still present significant difficulties for many digital processing environments. Further, more and more people are accessing information by connecting to on-line networks such as the internet, and the size of data objects plays a critical role in both access time and download or upload time.

To make the storage and transmission of large data sets more manageable, data compression methods have been developed which reduce the size of data. The objective of data compression is to represent an information source such as a video signal, image, or speech signal using a reduced number of bits with minimal degradation in quality.

There are two basic classes of compression methods, reversible (or lossless) and irreversible (or lossy). Reversible (lossless) compression techniques produce compressed representations of data which can be decompressed to generate output data identical to the original input data. Irreversible (lossy) compression methods generate representations of data which, after being decompressed, are never identical to original data, but rather are near approximations of original data. Irreversible compression, however, allows much higher compression ratios to be achieved, and is therefore used in many applications such as communications and storage where significant reduction of data volume is advantageous.

Irreversible compression methods typically comprise several sequential steps, some of which are irreversible, and others of which are reversible. Many compression methods use the sequence of steps: transformation, quantization, run-length coding, and entropy coding.

The transformation step gives an alternative representation of the input data, and is reversible provided that the transform arithmetic has sufficient precision. In the quantization step, transformed data values are approximated by rounding to the nearest member of a set of permitted quantizer output values. This step is irreversible because each quantizer output value only approximates an associated input value. The subsequent steps of run-length coding, and then of entropy coding the signals are both reversible.

This sequence of steps is used in many coding methods of commercial importance. For example, Joint Photographic Experts Group (JPEG) compression, which is an irreversible image compression standard, uses as a first step, a discrete cosine transform (DCT). See, for example, G. K. Wallace, "The JPEG Still Picture Compression Standard," *Communications of the ACM*, v. 34, pp. 30–45 (1991). The DCT, performed on 8×8 pixel blocks comprising an image, decorrelates the image data in that block. The transformed data values are referred to as coefficients. JPEG compression next performs scalar quantization of the coefficients, followed by run-length coding to produce run-level pairs of data values. In JPEG, each distinct run-level pair is represented by a unique Huffman code word, and efficiency is gained by the assignment of shorter Huffman code words to more commonly occurring run-level pairs.

A compression technique related to JPEG is used in the Moving Pictures Experts Group (MPEG) standards MPEG-1 and MPEG-2 as well as the ITU-T's low-bit-rate video coding standards H.261 and H.263, which are used for compression of video signals. See, for example, D. LeGall, "MPEG: A Video Compression Standard For Multimedia Applications," *Communications of the ACM*, v. 34, pp. 46–58 (1991). While these standards also employ motion estimation to take advantage of the similarities between nearby picture frames in a video sequence, the prediction error is coded using an method that includes the set of steps described above.

More recently, coding methods using discrete wavelet transforms (DWT) have also been developed and included in industry or government sponsored standardization efforts. For example, the Federal Bureau of Investigation has recently formally adopted the Wavelet Scalar Quantization (WSQ) method, which is based on the wavelet transform instead of on the DCT. In many DWT-based methods, including WSQ, after the wavelet transform is taken, quantization, run-length coding, and entropy coding are used.

Many lossless coding methods operating on digital data also involve the creation of lists of integers. These lossless methods work by using a predictor to estimate the value of each pixel. This results in a set of prediction error values which are integers, one for each pixel, that then must be losslessly compressed.

An important step in all of the above coding methods is the creation of a list of integers representing quantized data. This list can be described in terms of the size of runs of consecutive zeros, and the value or level of the nonzero coefficient that terminates each run of zeros. The numbers in this list are defined as (run, level) pairs. In particular, the way in which this information is mapped for subsequent entropy coding plays a critical role in the performance of the compression method. Previous methods have typically used a separate symbol to represent each(run, level) pair. The frequency of occurrence of all the symbols is tabulated, and is used in an entropy coding method in which frequently occurring symbols are represented using fewer bits.

What is needed to improve the art is a method whereby information represented as a list of integers, such as (run, level) pairs, can be substantially compressed.

SUMMARY OF THE INVENTION

One aspect of the present invention is a method of representing a stream of data values, wherein the data values have variable numbers of significant digits. The method comprises the steps of representing a most significant digit of each data value with a symbol from a first symbol set, and representing each significant digit other than the most significant digit of each data value with a symbol from a second symbol set.

A second aspect of the present invention is a method which reduces the number of values representing sequential groups of signed data values, wherein the groups comprise a fixed number of the data values, and wherein the fixed number is at least one. The method comprises the steps of assigning a sequence of symbols to a first of the data values, each of the symbols representing a significant digit, each of the symbols belonging to a first symbol set, the sequence of symbols uniquely identifying the absolute value of the first data value; and mapping a symbol representing a most significant digit in the sequence of symbols to a sign symbol from a second symbol set, wherein the sign symbol represents the most significant digit in the sequence and also represents the sign of the first data value, the second symbol set comprising at least two symbols different from the symbols of the first symbol set. In preferred embodiments of this method, a further advantageous aspect exists wherein the first data value is a member of a first of the groups and the sequence is a first sequence. This further aspect comprises the step of assigning a second sequence of symbols to a second of the data values of the first group, the symbols of the second sequence representing significant digits and belonging to the second symbol set, the second sequence uniquely identifying the second data value. Also, the second sequence of symbols uniquely identifies the absolute value of the second data value. The further preferred aspect comprises the step of mapping a symbol representing a most significant digit of the second sequence to a second sign symbol. The second sign symbol represents the most significant digit of the second sequence and also represents the sign of the second data value. The second sign symbol belongs to a third symbol set-which could be the same as the first symbol set—comprising at least two symbols different from the symbols of the second symbol set.

A further aspect of the present invention is a method which generates a reduced number of values to represent sequential groups of data values and which partitions data represented by the reduced number of values, wherein each of the groups includes at least one unsigned data value and one signed data value. This method comprises the steps of (1) assigning a first sequence of symbols to a first of the unsigned data values belonging to a first of the groups, each of the symbols representing a significant digit, each of the symbols belonging to a first symbol set, the first sequence of symbols uniquely identifying the value of the first unsigned data value; (2) assigning a second sequence of at least two symbols to a first of the signed data values belonging to the first group, each of the symbols representing a significant digit, each of the symbols belonging to a second symbol set and not belonging to the first symbol set, the sequence of symbols uniquely identifying the absolute value of the first data value, the second symbol set including at least two symbols different from the first symbol set; (3) mapping a symbol representing a most significant digit in the second sequence of symbols to a sign symbol comprising a symbol from the first symbol set, the sign symbol representing the most significant digit in the second sequence and also representing the sign of the first signed data value; and (4) generating first and second partitioned symbol groups by removing a least significant symbol representing a least significant bit from the second sequence of symbols to produce the second partitioned symbol group which comprises symbols remaining in the second sequence after the removal, and appending the least significant symbol removed from the second sequence of symbols to the first sequence of symbols to produce the first partitioned symbol group which comprises the first sequence of symbols and the least significant symbol, the least significant symbol positioned after any symbols representing any bits of the first sequence of symbols. In preferred embodiments of this method, a further advantageous aspect exists wherein the first sequence of symbols is empty and has no symbols, the removed least significant symbol therefore comprising the only symbol in the first partitioned symbol group.

In one application of this invention, a new mapping of a list of (run, level) pairs into symbols is used. This invention takes advantage of the fact that the unsigned binary representation of any number, considering only significant bits, is a word that begins with "1", and that if some other means is used to represent the number of digits of the binary word, then this "1" does not need to be explicitly coded. In the present invention, binary representations for runs and levels are ordered from least significant bit (LSB) to most significant bit (MSB), where the MSB is always 1. In the majority of run values and level values, it is possible to explicitly omit encoding the MSB by using another means of terminating the word.

A "word" is thus defined as a sequence of symbols. One set of words to represent values derives from a symbol set containing four symbols, e.g. 0, 1, +, and −, whose meanings depend on the context of usage or which of two contexts in which an encoder/decoder pair is operating. In each of these contexts, all four of the symbols are used, though they occur with different relative frequencies.

In one embodiment, the symbols comprise two pairs. The first pair of symbols is used predominantly to represent binary 1's and 0's of run lengths, and its two members appear with greater frequency in the first context, such as a location list related to the runs of zeroes between nonzero signals. The second pair of symbols is used predominantly to represent binary 1's and 0's of the second context, related to the nonzero levels, and these symbols appear with greater frequency in the second context. In this context, the sign of each level is represented using one member of the first pair of symbols.

The symbols that result from this mapping give increased coding efficiency for several reasons. First, the mapping process itself eliminates explicit representation of the MSB for both run values and level values. This reduces the number of output symbols, and contributes directly to greater efficiency.

Furthermore, the presence of two contexts is used to increase the performance of the entropy coding step that follows the mapping to symbols. Separate probability tables are developed for each context, and these probability tables are used to design optimized entropy codes. If the statistics of the symbol occurrences in the two contexts changes, the entropy codes are adapted.

One application of this invention thus results in greater compression of data represented by (run, level) pairs. The invention can be applied to (run, level) pairs of data using the following steps of receiving a data stream of words representing run values and words representing signed stack or level values. The words representing run values and words representing signed level values are converted into four distinguishable symbols. (0, 1, + and −). The four symbols comprise two pairs of distinguishable symbols each, (+, −) and (0, 1). A first of the two pairs of distinguishable symbols, (+, −), is used to represent the words representing run values of the data stream. A second of the two pairs of distinguishable symbols, (0, 1), is used to represent an unsigned value of the words representing level values of the data stream. Each word representing the unsigned level values is assumed to have an unexpressed most significant bit (1). One of the distinguishable symbols of the first pair, (+, -), is used with the second pair, (0, 1), of the distinguishable signals to represent a sign of the level values. The words representing run values and words representing signed level values are partitioned into two contexts wherein one of the second pair of symbols, (0, 1), signifies the end of the words representing run values, and wherein one of the first pair of signals, (+, -), signifies the end of the words representing level values. As a result, compression of data is increased.

In another embodiment the step of partitioning the words representing run values and words representing signed level values into two contexts comprises the step of partitioning the symbol stream to create a first one of the two contexts to include one or more of the first pair of symbols to represent a run value and also to include the least significant bit of a next level value, and a second one of the two contexts to include one or more of the second pair of symbols representing all bits in the level word except the least significant bit.

In another embodiment the step of partitioning the words representing run values and words representing signed level values into two contexts comprises partitioning the data stream into a first one of the two contexts. A first context comprises all the symbols of words representing run values, excluding the first symbol of all words following a (level-run) transition from level values to run values, and including the first symbol of all words following a (run-level) transition from run values to level values. A second context is comprised of all the remaining symbols.

BRIEF DESCRIPTION OF THE DRAWINGS

FIG. 3a is a table illustrating an input data array.

FIG. 3b illustrates a horizontal scan of an input data array.

FIG. 3c illustrates an output symbol string resulting from a horizontal scan.

FIG. 3d illustrates a vertical scan of an input data array.

FIG. 3e illustrates an output symbol string resulting from a vertical scan.

FIG. 3f illustrates a zig-zag scan of an input data array.

FIG. 3g illustrates an output symbol string resulting from a zig-zag scan.

FIG. 4a illustrates a table representing an input data array.

FIG. 4b shows an example of an output symbol stream resulting from a horizontal scan of an input data array.

FIG. 4c illustrates the application of run/level coding to an output symbol stream resulting from a horizontal scan.

FIG. 4d shows an example of run/level pairs created by run/level coding.

FIG. 4e shows an example of run/level output created by run/level coding.

FIG. 5 illustrates two examples of symbol maps used to map symbol groups to run values.

FIG. 7 illustrates two examples of symbol maps used to map symbol groups to level values.

FIG. 10a is a table representing an input data array.

FIG. 10b shows an example of run/level output resulting from a horizontal scan of an input data array.

FIG. 10c shows an example of symbols mapped to run values and level values resulting from a horizontal scan of an input data array.

FIG. 10d shows an example of a symbol stream produced by a symbol

FIG. 20a illustrates an example list of floating point numbers and the corresponding mantissa and exponent of each.

FIG. 20b illustrates quantization of example 24-bit mantissa values.

FIG. 20c illustrates a two-dimensional array of quantized mantissa values and corresponding exponent values.

FIG. 20d illustrates run/level pairs resulting from a vertical scan of an example two-dimensional array of mantissa values and exponent values.

FIG. 20e illustrates run/level pairs resulting from a horizontal scan of an example two-dimensional array of mantissa values and exponent values.

DETAILED DESCRIPTION OF THE PREFERRED EMBODIMENTS

Figure 1:
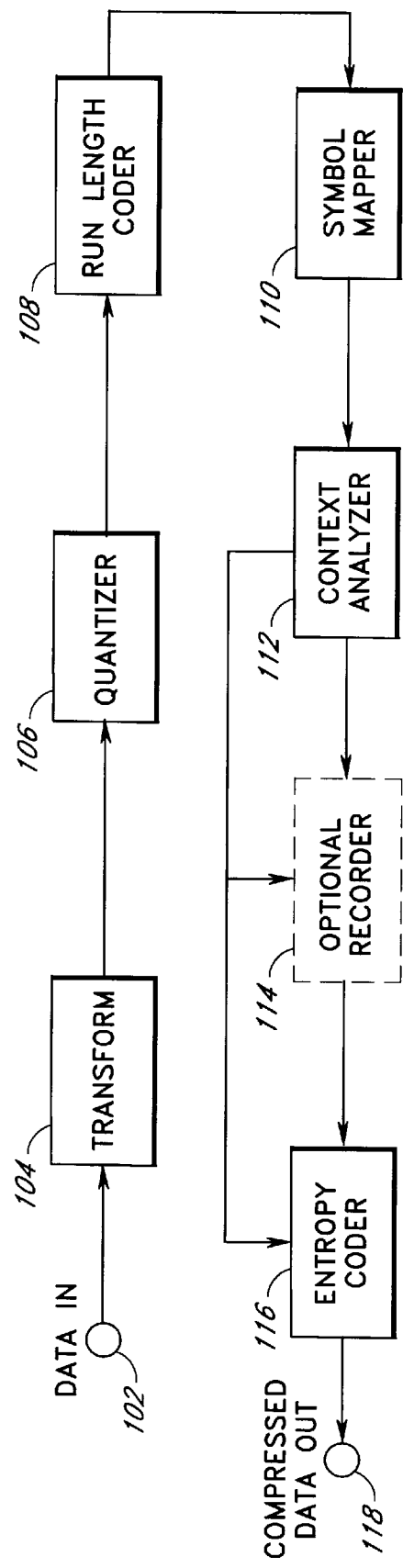
FIG. 1 is a block diagram illustrating a data compression system which uses the present invention.

FIG. 1 is a block diagram illustrating one example of a data compression system which uses the invention. Data compression systems like the one shown in FIG. 1 can compress many types of data such as, for example, image, video, or sound. Whereas the data may have originated as analog signals, it is presumed to have been converted to a digital format and presented at input terminal 102. Such analog-to-digital conversion is common in the art.

The digital data at input terminal 102 is input to a transform processor 104. The transform processor 104 generates transformed data which provide an alternative representation of the input data. The transform processor 104 can use one of a number of known transforms including, for example, Fourier, discrete cosine, or wavelet. The transform processor 104 may be a software configured computer or a custom firmware or hardware circuit for performing the desired transform.

The transformed data is then input to a quantizer 106 coupled to the transform processor 104. The quantizer 106 maps the transformed data into a smaller set of output values. Quantization typically involves identifying a number of value ranges such that all data whose values lie within any particular range are replaced with a uniform value. Thus, for example, all values of transformed data between 0.5 and 1.5 might be replaced by 1. Quantization causes a loss of resolution in the transformed data, the degree of such loss depending on the number and size of ranges (or quantization bins) selected.

Quantization generally, however, preserves significant contrast and transition events represented in transformed data. Quantization facilitates compression (1) by mapping floating point data to integer data to reduce the number of different bits needed to represent each datum and (2) by substantially reducing the number of values that can occur in the data. A further compression strategy employed by many quantizers is to identify a high-frequency value range—one particular value range within which will lie the values of a significant percentage of input data. Quantizers employing such a strategy will replace with a zero each input datum whose value is within this high frequency value range. In many cases, this high frequency value range comprises values near zero, and thus, in many quantizers, it is the range of values near zero that are mapped to zero values. Quantization is known in the art and will not be further described herein. The quantizer 106 may be a software configured computer or a custom firmware or hardware circuit for performing the desired mapping.

After quantization, the quantized data consist of positive and negative integers, and in some cases, a large percentage of these integers will be zero. The quantized data are input to a run-length coder 108.

The run-length coder 108 performs at least two functions. First, the run-length coder 108 orders the quantized integer data into a one-dimensional list of integers. Second, the run-length coder 108 converts this list of integers into a sequence of (run, level) pairs, where "run" is a number representing a count of zeros occurring in consecutive order in the list of integers, and "level" is a number representing the value of a nonzero integer occurring immediately after a series of consecutive zeros. In all cases where a nonzero integer is not immediately preceded by a zero, each such nonzero integer is represented by a (run, level) pair in which the run has a value of zero and the level is the value of the nonzero integer. The run-length coder 108 will output a sequential list of integers in run/level output order. Thus, the first integer output will be a run value, the second a level value, the third a run value, the fourth a level value, and so on. The run-length coder 108 may be a software configured computer or a custom firmware or hardware circuit for performing (run, level) pairing. Run-length coding is known in the art.

After run-length coding, the run/level coded integers are mapped into symbols using a symbol mapper 110. Advantageously, the symbol mapper 110 assigns to each run value a set of symbols (or a word), where such symbols belong to a first alphabet. The symbol mapper 110 further assigns to each level value a set of symbols (or word), drawn from a second alphabet. As will be explained in greater detail below, the mapping of run and level values into words made up of symbols taken from different alphabets facilitates substantial improvement in the eventual compression ratio achieved. The symbol mapper 110 may be a software configured computer or a custom firmware or hardware circuit for performing the mapping into symbols.

The output of the symbol mapper 110 is coupled to a context analyzer 112. The context analyzer, too, may be a software configured computer or a custom firmware or hardware circuit. The context analyzer 112 advantageously partitions a sequence of run and level words generated by the symbol mapper 110 into two different contexts. As will be described in more detail herein, partitioning the run and level words into differing word-oriented contexts allows greater compression to be achieved by the later step of entropy coding.

The present invention preferably includes an optional reorderer 114 which reorders symbols within the run and level words prior to the step of entropy coding. As will be described in more detail below, symbol reordering can result in still greater compression ratios when run/level coded data contain large percentages of high run or level values.

The reordered data are input to an entropy coder 116, which preferably comprises an adaptive arithmetic coder, but may alternatively be a conventional Huffman coder or other known entropy coder. The preferred adaptive arithmetic coder is responsive to both run-oriented and level-oriented contexts, and can thereby achieve greater compression. Adaptive arithmetic coding is known in the art. See, for example, I. H. Witten, R. Neal, and J. G. Cleary, "Arithmetic Coding For Data Compression," *Communications of the ACM*, v. 30, pp. 520–540 (1987); Y. H. Kim and J. W. Modestino, "Adaptive Entropy Coded Subband Coding Of Images," *IEEE Trans. Image Processing*, v. 1, pp. 31–48 (1992). The preferred entropy coder 116 switches coding contexts upon receiving from the context analyzer 112 (1) a group of symbols associated with a particular context and (2) a command to select the particular coding context. Entropy coding (such as arithmetic coding) is a method of compressing data by minimizing the number of bits used to represent the most frequently occurring data values in input data. The entropy coder 116 may be a program-enabled computer, or a firmware or hardware circuit. The entropy coder 116 produces a compressed bit stream, which represents the final result of the data compression system of FIG. 1.

Figure 2:
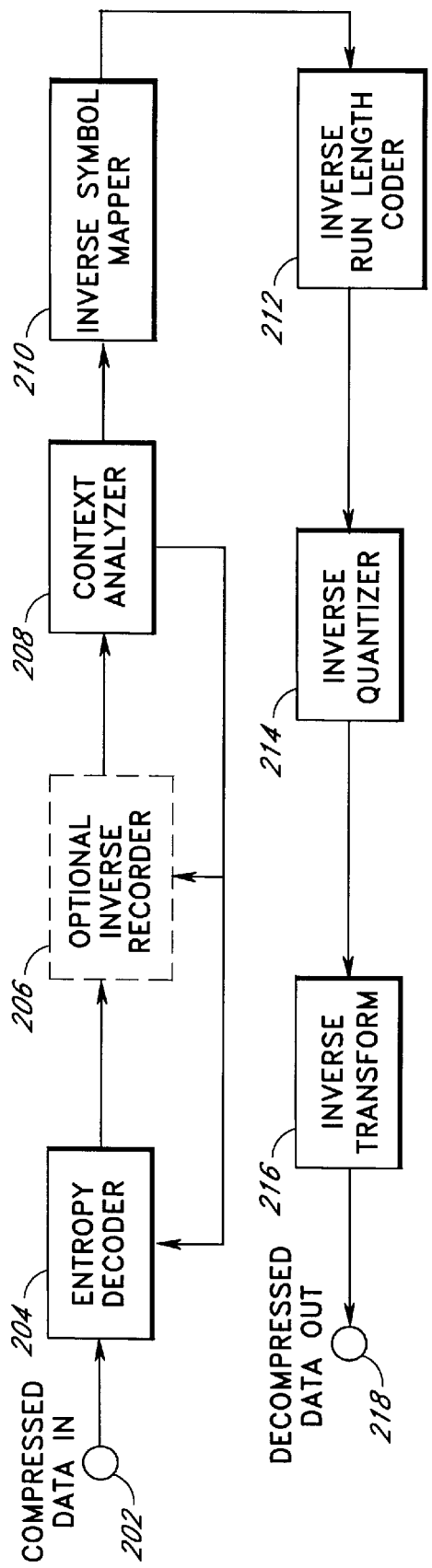
FIG. 2 is a block diagram illustrating a data decompression system which uses the present invention.

FIG. 2 is a block diagram of a digital decompression system. Compressed bit stream data at input terminal 202 are input to an entropy decoder 204 which reverses the entropy coding performed by the entropy coder 116. The entropy decoder 204 outputs symbols which comprise run or level words. The decompression system of FIG. 2 preferably includes a reverse symbol reorderer 206 if corresponding symbol reordering was performed during compression. As further described below, a context analyzer receives decoded symbols from the entropy decoder 204 and controls context-sensitive entropy decoding in cases where entropy coding was performed in a context-sensitive manner. The output of the entropy decoder 204, as assisted by the context analyzer 208, is a stream of symbols which is input to an inverse symbol mapper 120.

The inverse symbol mapper 210 recognizes run symbols and level symbols within the input symbol stream, and converts both run symbols and level symbols into integer values. The output of the symbol mapper 210 is a sequence of integers in a run/level coded output. The run/level coded output is input to an inverse run-length coder 212. The inverse run-length coder 212 responds to each integer run value by outputting a number of zeros equal to the run value, and responds to level values by simply outputting the level value integer. Thus, the inverse run-length coder 212 reverses the run/level coding to yield quantized integer data.

The quantized integer data are input to an inverse quantizer 214. The inverse quantizer 214 replaces each integer with a floating-point value approximating that integer's original pre-quantization, floating-point value. The output of the inverse quantizer thus represents an approximation of transformed data, the data therefore being at least slightly different from the original transformed data output by the transform processor 104. The approximated transformed data are input to an inverse transform processor 216. The inverse transform processor 216 reverses the transform (Fourier, discrete cosine, wavelet, or other) performed by the transform processor 104. The output of the inverse transform processor 216 is an approximation of the original data input to the data compression system of FIG. 1.

An example will make the advantageous coding and decoding methodology clear. Transformation and quantization are known and will not be further described except to indicate that transformation and quantization performed in respective sequence may yield data containing relationships in two or more dimensions. When two or more dimensions are represented in input data, a first function of the run-length coder 108 is to map the data into a one-dimensional list.

FIGS. 3c–3g illustrate several of the many patterns in which two-dimensional data can be scanned. FIG. 3a shows a two-dimensional data array 302 arranged in a 4×4 matrix. The two-dimensional data array 302 of FIG. 3a can be scanned in at least three different ways to obtain a one-dimensional data array, namely by a horizontal scanning pattern 304 of FIG. 3b to obtain the data string 306 of FIG. 3c, by a vertical scanning pattern 308 of FIG. 3d to obtain the data string 310 of FIG. 3e, or by a zig-zag scanning pattern 312 of FIG. 3f to obtain the data string 314 of FIG. 3g. These types of scans can also be applied to higher dimensional data as well. For example, three-dimensional data can be scanned by applying the scanning patterns discussed above to a first plane of two-dimensional data, then to second and subsequent planes of two-dimensional data.

The second function of the run-length coder 108 is to convert a sequential list of integers into run/level output form. FIGS. 4c–4e illustrate the conversion of a list of integers into run/level output form. FIG. 4a represents a two-dimensional array 402 of integers as might be output by a quantizer. Applying the horizontal scan pattern 304 (FIG. 3b) to the two-dimensional array 402, the resulting sequential list of integers 404 is obtained as shown in FIG. 4b. FIG. 4c illustrates how the sequential list of integers 404 is converted by the run-length coder 108 into run/level coding. First, the run-length coder 108 counts the leading zeros 406. Because there are three leading zeros 406 before encountering a nonzero value, the first run value 408 has a value of 3. The first non-zero value encountered 410 is 35; thus, the first level value 412 has a value of 35. Next, the run-length coder 108 scans again for zeros. This time, however, there are no zeros 414 before encountering a non-zero value. Thus, the next run value 416 is zero. Because 4 is the next non-zero value 418 encountered, the next level value 420 is 4. The run-length coder 108 again scans for zeros, finding ten zeros before encountering a non-zero value. Thus, the next run value is 10. The non-zero value encountered immediately after the ten zeros is −11, therefore the next level value is −11. FIG. 4d illustrates the three run/level pairs created by the run-length coder 108 from the sequential integer list 404. The final output from the run-length coder 108 is the run/level output 422 shown in FIG. 4e. Run-length coding is known in the art and will not be further discussed.

Data in run/level output form can be input to the symbol mapper 110 of the present invention. The symbol mapper 110 of the present invention can accept as input any sequential list of grouped data elements and is not limited to data in run/level output form. The advantageous function of the symbol mapper 110, as it might apply to run/level output data, is to map both run values and level values to representative symbol sets or words.

Symbol Map 1 502 of FIG. 5 shows one example of a mapping of words to run values that could be used by the symbol mapper 110 of the present invention. The symbol mapper 110 assigns a unique word to each run value. Each word consists of one or more symbols which, in this example, are taken from a two-symbol alphabet. In the example presented in FIG. 5, the two-symbol alphabet contains the symbols "+" and "−".

Each run value then is associated with a symbol set, or "word", which is a group of n symbols taken, in this example, from a two-symbol alphabet where n ranges from 1 up to an arbitrarily high number. There are a total of $2^n$ possible words of length n. For example, as shown in Symbol Map 1 502, there are 2 words of length 1, 4 words of length 2, and 8 words of length 3. In general, if there are m different symbols in the alphabet for representing runs, then there are $m^n$ possible words of length n.

To improve coding efficiency, it is desirable that shorter words be used to represent run values that have a higher probability of occurrence. For typical image and sound data, the run-length coder 108 is more likely to produce runs that are small. Symbol Maps 1 and 2 (502, 504) in FIG. 5 takes advantage of this fact and associates small run values with short words.

It is also desirable to perform the mapping such that the symbols comprising words appear with unequal probability. This will lead to greater efficiency in the entropy coding performed by the entropy coder 116. Given knowledge that smaller run values are more probable than larger run values in certain input data, Symbol Map 2 504 illustrates a particular mapping that will cause the symbol "+" to occur more frequently than "−". Symbol Map 2 thus is arranged such that, among any group of words having the same number of symbols, words associated with the smallest run values contain the most "+" symbols. Thus, where run values have a higher probability of being small, Symbol Map 2 504 can be expected to cause the symbol mapper 110 to output run words in which the "+" symbol will appear with greater frequency than the "−" symbol.

Figure 6:
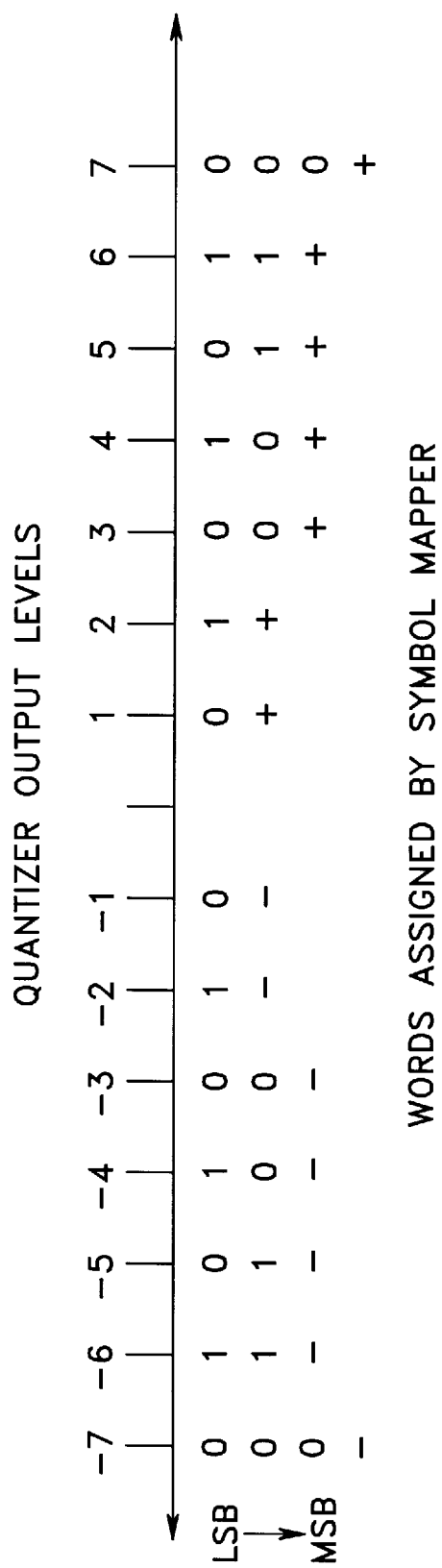
FIG. 6 illustrates an example of symbol groups that are mapped to quantized level values.

FIG. 6 illustrates the mapping of level values into symbols. In contrast with the run values generated by the run-length coder 108 which are always positive, level values which are generated by the quantizer 106 can be either positive or negative. To accurately preserve the distribution of data in the input data set and the symbol mapper 110 must preserve the sign of all level values. In this example, an alphabet of four symbols ("1", "0", "+", and "−") is used for mapping of level values.

In the example of FIG. 6, the "0" and "1" symbols are assigned to words in a binary counting manner to represent both the increasing positive level values and the decreasing negative level values. The "+" and "−" symbols are used to represent the most significant bit (MSB) of the level values which is always 1. A "+" is used to represent the MSB of positive level values, and a "−" is used to represent the MSB of negative level values.

It is important to note that in relation to the present invention, significant digits refers generally to the minimum number of digits needed to represent a value. For example, in a positive binary number, significant digits do not include 0's to the left of the leftmost 1 (e.g., the significant digits of the value 00100101 do not include the leftmost two zeros, in other words the significant digits include 100101).

The invention relies on the ability to distinguish run values from level values. Because a level word of "+" or "−" would be indistinguishable from a run word in the examples of FIGS. 5 and 6, every level value must contain at least one "0" or "1" in addition to its MSB symbol ("+" or "−").

As a result of this restriction, there is an offset of one between the level values and their binary representations in the words. For example, a level value of 4 is mapped not to +00 (note the ordering of the symbols is from MSB to LSB), which would correspond to a binary 100 where the MSB has been represented by "+", but instead by +01. Also, a level value of 0 does not need to be mapped to a level word because all zeros are expressed by run values.

It is important to note that the exclusive use of two symbols ("+" and "−") to represent the MSB in level words is advantageous because such use serves simultaneously to indicate the sign of level words as well as to mark their termination. It is also important to note that because the LSB symbol of each level word is a symbol which can never occur in a run word, the termination of every run word in a stream of symbols representing run/level output is indicated by an LSB symbol of a level word. Note further that the termination of run words by an LSB symbol of a level word also serves to identify empty run words. In other words, run values of zero which are not mapped to any symbols can be identified within a symbol stream.

Although FIG. 6 demonstrates a binary value correspondence between level values and the words to which they are mapped, the symbol mapper 110 of the present invention could employ a symbol map (or look up table) to alternatively assign words to level values that do not have a binary correspondence. FIG. 7 illustrates two symbol maps which could be used to assign words to level values. Symbol Map 1 702 represents the symbol mapping strategy of FIG. 6 wherein words are assigned to level values in a binary ascending order. Symbol Map 2 704, however, represents an alternate map for associating words with level values. As explained above with respect to symbol mapping for run values, additional efficiency in entropy coding can be gained when input symbols appear with unequal probability. Within any group of level words having the same length, Symbol Map 2 arranges the words so that the symbol "0" occurs more frequently in words associated with small level values. Thus, in the case where run/level coded data contain a large percentage of low level values, better compression ratios could be expected by using Symbol Map 2 704 instead of Symbol Map 1 702.

Using symbol maps to assign words to level values is impractical when run or level values in run/level coded data are extremely large. Thus, the symbol mapper 110 of the present invention preferably assigns words to level values using a series of steps to construct a word given any level value. In cases where run/level output can be expected to contain very large run values, a series of steps can also be used to assign words to run values, replacing the use of a symbol map. One such method will be described below. The preferred symbol mapper 110 of the present invention, however, uses a symbol map 504 (look-up table) to assign words to run values, while performing a series of iterative steps to construct words for input level values.

Figure 8:
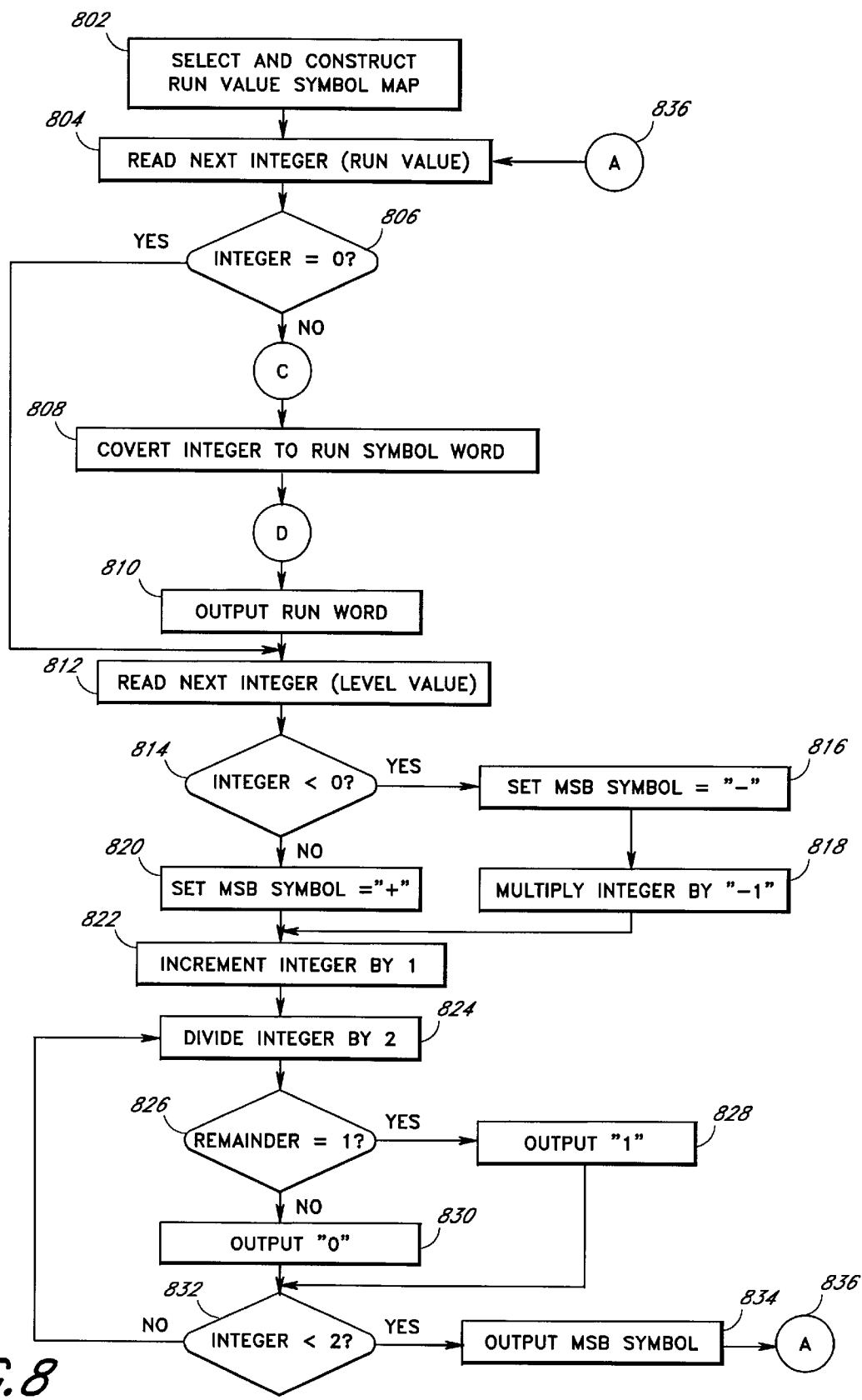
FIG. 8 is a flowchart representing steps performed by a symbol mapper.

FIG. 8 is a flowchart representing the steps performed by the preferred symbol mapper 110. An initial step 802 provides a Symbol Map (502, 504) to the symbol mapper 110 for assigning words to run values. The symbol mapper 110 then begins in a step 804 by reading the first integer from the run/level coded data. Because run/level coded data always begin with a run value integer, the symbol mapper 110 can always treat the first integer as a run value. If a run value integer is zero in a step 806, the symbol mapper 110 of the present invention will not attempt to associate a word nor will it output a word, and it will immediately read in the next integer which will be a level value. It will be understood then, that the symbol mapper 110 of the present invention will respond to run values of zero by generating no output symbols, and hence that an empty set of symbols encountered in the output of the symbol mapper 110 represents a zero run value. Such an empty set of symbols is indicated by the occurrence of two adjacent level words in the output of the symbol mapper 110 with no symbols (i.e., an empty set of symbols) separating the two level words.

If a run value integer is not zero in the step 806, the symbol mapper 110 uses the run value integer as an index into a symbol map (502, 504) to look up the word that is associated with that particular run value, thereby converting the run value integer to a run symbol word in a step 808. The symbol mapper 110 will then output that word in a step 810. After outputting a word associated with a run value, the symbol mapper 110 will read the next integer in a step 812 which will be a level value and then proceed to construct a word to represent that level value. If in a step 814 the level value integer is negative, then a symbol variable (MSB symbol) is set to "−" in a step 816 and the integer is multiplied by −1 in a step 818 to make it positive; otherwise the MSB symbol variable is set to "+" in a step 820.

Next, to account for the offset of one required to ensure that level words can always be distinguished from run words, the level value integer is incremented by one in a step 822. The symbol mapper 110 then begins to iterate through a loop which repeatedly divides the level value integer by 2 in a step 824, checks the remainder in a step 826, and outputs a "1" in a step 828 if the remainder is 1 or outputs a "0" in a step 830 if the remainder is zero. The loop terminates in a step 832 when the integer is less than 2. When the loop terminates, the MSB character (assigned at either the step 816 or the step 820) is output in a step 834 as the terminal symbol for the level word. The symbol mapper 110 then continues via a step 836 by reading the next integer in a step 804 which will be a run value integer. The symbol mapper 110 terminates when the run/level coded input is exhausted.

Figure 9:
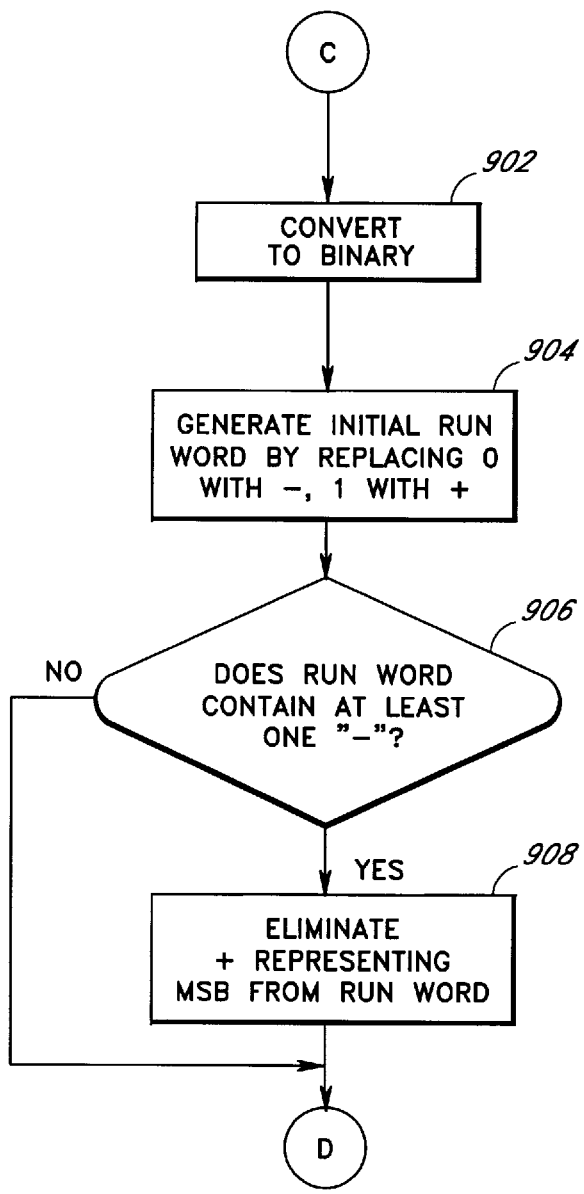
FIG. 9 is a flowchart representing steps to map a group of symbols to a run value.

When large run values are expected in run/level coded data, it may be desirable to use a series of steps to construct words to represent run values rather than assigning words through the use of a symbol map. FIG. 9 is a flowchart which illustrates a method for constructing words to represent run values. The steps illustrated in the flowchart of FIG. 9 replace the step 808 of converting a run value integer to a run symbol word of FIG. 8, and this replacement enables the steps described in the flowchart of FIG. 8 to fully describe a symbol mapper which does not use a symbol map to assign words to either level values or run values.

As shown in FIG. 9, one method for constructing words to represent run values, is to first convert a run value integer into a binary number (e.g., decimal 11=binary 1011, MSB first). Next, in a step 902, a symbol mapper using the method illustrated in FIG. 9 replaces all 1's in the binary number with "+" and replaces all 0's with "−" (e.g., 1011 becomes "+−++"). The symbol mapper then determines in a step 906 whether there are any "−" symbols in the run word created in the step 904.

If not, the word is complete, and is output in the step 810 (of FIG. 8). If, however, there is a "−" symbol in the run word created in the step 904, then in a step 908, the "+" representing the MSB symbol of that run word is eliminated. Thus, in the example of a run word of "+−++", the MSB symbol ("+") is eliminated, to create the run word "−++" (in order from MSB to LSB).

An alternative step which replaces step 906 of FIG. 9 (and which is not illustrated in FIG. 9) checks whether the run value integer is one less than a power of two). If not, the run word created by the step 904 is complete and is output in the step 810 (of FIG. 8). (e.g., a run value of 3 is one less than a power of two; thus, its binary form 11 results in a word of "++"). If the run value integer is not one less than a power of two, then in the step 908 the "+" symbol which is the MSB symbol for the word, is eliminated. Thus, for example, a run value integer of 5 is not one less than a power of two, and thus its binary form 101 would result in a symbol word of "+−+", and the MSB symbol "+" would then be eliminated, creating the word "+−" (note here that the symbols are ordered from LSB to MSB).

The words resulting from such steps utilize the fewest possible of the two symbols "+" and "−" to uniquely identify run values that begin at one (run values of zero are not converted to words). Also, the steps described in FIG. 9 associate the words of shortest length with the smallest run values. These steps result in the symbol mapping 502 illustrated in FIG. 5.

It will be appreciated by one skilled in the art, that the symbol mapper of the present invention can use a symbol map or a logical construction method, or a combination of both, to assign words to either run values or level values. Symbol maps such as illustrated in FIGS. 5 and 7 are advantageously used when the run and or level values are confined to a limited range. For example, if the transform processor 104 is performing a discrete cosine transform on an image array of size 8 pixels by 8 pixels, the maximum run value would be 64, and a symbol map would be the preferred method of replacing run values with run words. Also, for example, if the transform processor 104 is performing a discrete cosine transform on an image array of size 8 pixels by 8 pixels, and it is known that the output of the quantizer will never exceed a value of several thousand, then a symbol map for the level values would be the preferred method.

On the other hand, if the present invention is applied in a wavelet transform system in which the data set is large enough to permit run values of many hundreds of thousands or greater, then a logical construction method is preferred. This occurs because use of a symbol map in this case would require a look up table with many hundreds of thousands of entries, which would be expensive using current hardware memory devices. However, it will be understood that as memory devices increase in capacity in the coming years, longer and longer look up tables will become more practical to implement.

It will also be understood by one skilled in the art that the logical construction method illustrated in FIGS. 8 and 9 represents only one of many such methods that could be used for associating arbitrarily large run and level values with words. It will further be understood by one skilled in the art that any permutation of the words in FIGS. 5 and 7, or of the words generated by the logical construction method of FIGS. 8 and 9, will still lead to a valid symbol mapper. Some of these permutations will be more advantageous than others because they will associate shorter words with more common run values or level values, and because they will lead to a more uneven distribution of symbols at the output of the symbol mapper. However, in the case of a logical construction method, the permutations that are advantageous from a compression standpoint may require a more complicated logical construction method. Whether the improvement in compression performance achieved by the permutation justifies the added complexity in the logical construction method would depend on the application to which the present invention was being applied.

The symbol mapper of the present invention is not limited to pairs of data in which the first data value in a pair is unsigned and the second data value in a pair is signed, as the symbol mapper will operate on grouped data values where all data values in a group are signed or where all data values in a group are unsigned. Further, the symbol mapper is not limited to paired data elements, such as the described run/level pairs, but is useful also to construct words representing single, triplet, quadruplet or other groupings appearing in sequence. Also, the symbol mapper is not limited to the use of any particular symbols of any particular alphabet.

FIGS. 10a–10d illustrate an exemplary application of the symbol mapper 110. FIG. 10a represents a two-dimensional data array 1002 that is converted by the run-length coder 108 into run/level output 1004 as shown in FIG. 10b. The sequential list of integers of the run/level output 1004 is "3, 35, 0, 4, 10, −11." The symbol mapper 110 first reads the 3 as a run value integer and performs a look up in the Symbol Map 502. The word associated with run value 3 in the Symbol Map 502 is "++", and the symbol mapper 110 then outputs the word, "++". Next, the symbol mapper 110 reads the next integer, 35, as a level value integer. By iterating through the logic described above beginning with the step 812 of FIG. 8, the symbol mapper constructs the word "00100+" and outputs that word.

The symbol mapper 110 next reads a 0 as a run value integer and thus performs no look up and does not produce any output. The next integer that the symbol mapper 110 reads is the level value 4. The symbol mapper 110 produces through logic the word "10+" to represent a level value of 4 and outputs that word.

A run value integer of 10 is next read by the symbol mapper 110. The symbol mapper 110 uses 10 as an index into the Symbol Map 502, and looks up the word "−+−", and outputs that word. The symbol mapper 110 then reads the next integer, −11, as a level value integer and constructs the word "001−" through logic. The symbol mapper then outputs the level value word "001−" and terminates because the run/level coded input is exhausted.

FIG. 10c shows the run words and the level words produced by the symbol mapper 110. The symbol stream output by the symbol mapper 110 is illustrated in FIG. 10d. The symbol stream in FIG. 10d is a concatenation of the run words and level words in the order output by the symbol mapper 110.

Figure 11:
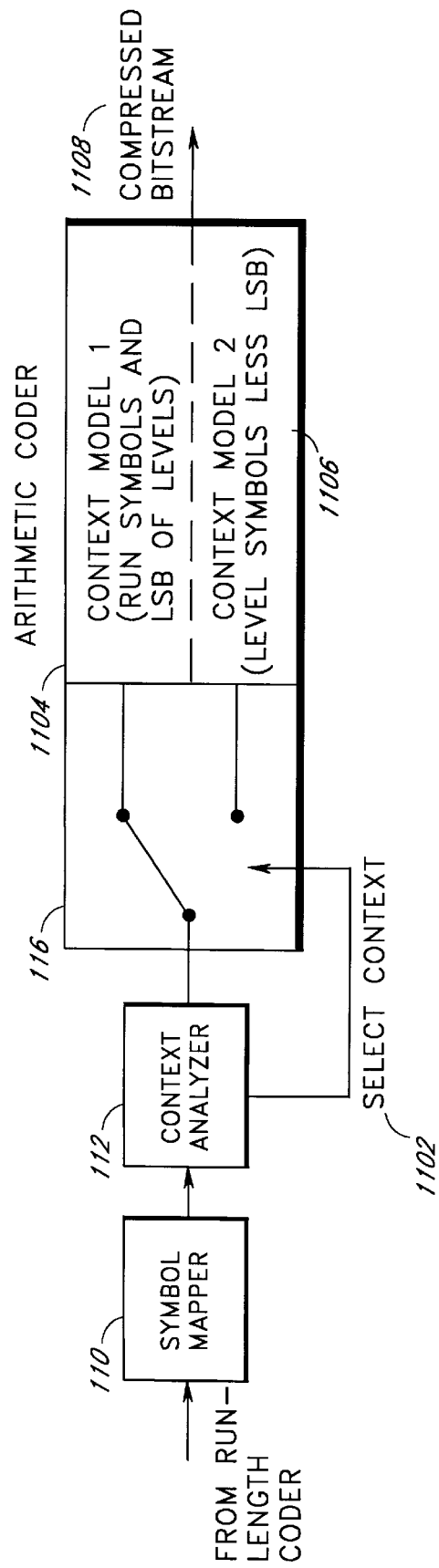
FIG. 11 is a block diagram illustrating symbol mapping performed on run/level output to produce a stream of symbols and context-oriented arithmetic coding performed on a symbol stream to produce a compressed bitstream.

FIG. 11 is a block diagram which illustrates the flow of data from the symbol mapper 110 into the context analyzer 112 and then into the arithmetic coder 116. The symbol stream produced by the symbol mapper 110 is input to the context analyzer 112. The context analyzer examines the input symbols and detects changes in context (run context or level context) indicated by the differences between the respective alphabetic symbols comprising run words and level words.

The context analyzer 112 performs two functions. First, the context analyzer 112 partitions the symbol stream into two different types of symbol groups. The context analyzer 112 performs this partitioning by breaking up the symbol stream into groups of symbols each of which is slightly different than a run word or a level word. The second function performed by the context analyzer 112 controls the context of arithmetic coding. Both functions of the context analyzer are described more fully as follows.

Figure 12:
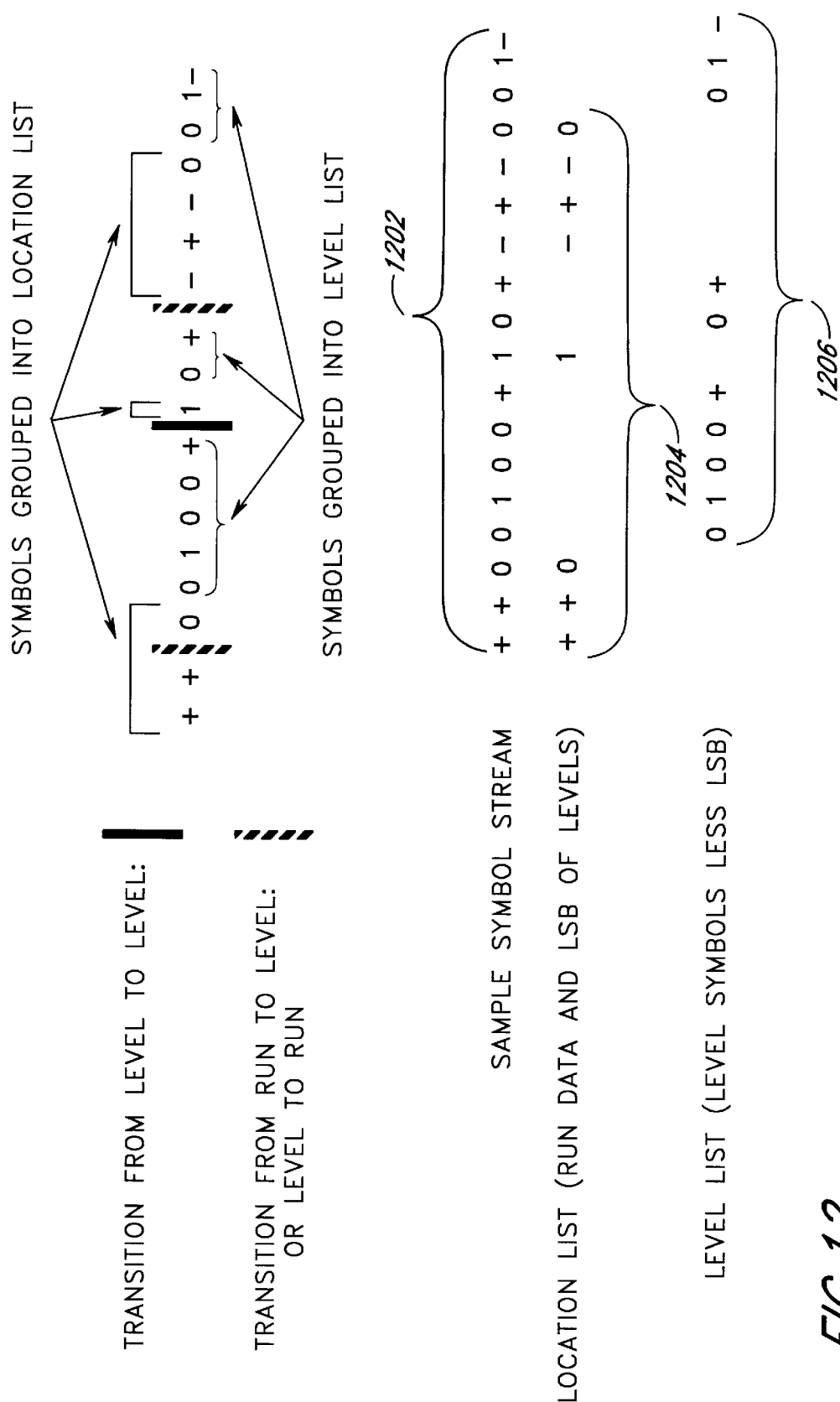
FIG. 12 illustrates an example of symbol groups partitioned into a location list and a level list from an example symbol stream.

FIG. 12 illustrates the context analyzer 112 function of partitioning the input symbol stream 1202 into two different types of symbol groups. The first type of symbol group consists of a run word and the least significant bit (LSB) of the following level word. The symbol groups of this type comprise a location list 1204. Thus, as the symbol stream 1202 is scanned by the context analyzer 112, the context analyzer 112 will ascertain all symbols comprising a run word by encountering a "0" or "1" symbol (which can never be part of a run word). This "0" or "1" will always represent the LSB of the following level word. Instead of breaking the symbol stream 1202 at the end of the run word and passing the run word to the arithmetic coder 116, the context analyzer 112 adds the LSB of the following level word to the run word and passes this new group of symbols to the arithmetic coder 116. For example, when a run word of "++" and a level word of "00100+" occur in order (i.e., "++00100+") in an input stream, as shown in FIG. 12, the context analyzer 112 will make a new location list symbol group by concatenating the run word "++" with the first (LSB) symbol of the following level word "0" to comprise the new symbol group "++0".

The second type of symbol group created by the context analyzer 112 can be described simply as level words without a LSB. The context analyzer 112 will already have seen the LSB of a level word when it is constructing a group of symbols of this second type; thus, the context analyzer 112 can recognize the termination character of the level word by encountering a "+" or "−" which is the MSB (always the last symbol) of the level word. The symbols seen by the context analyzer not yet sent to the arithmetic coder 116, up to and including the MSB encountered, will comprise the second type of symbol group to send to the arithmetic coder 114. The groups of symbols of this type comprise the level list 1206. Using the example described above for location list symbol groups, assume that the run word "++" and the level word "00100+" occur in order in a symbol stream as "++00100+", and assume further that the context analyzer has already created a new location list symbol group "++0". The next level list symbol group output by the context analyzer 112 will be "0100+" (i.e., the original level word less its LSB symbol "0").

Entropy coding is preferably performed by an arithmetic coder 116 that is not only adaptive, but which can also code data in different contexts. The present invention will obtain superior compression levels using an arithmetic coder 116 (FIG. 11) capable of maintaining two context models during coding—one context model 1104 for coding a first symbol stream and a second context model 1106 for coding a second symbol stream, where the first and second symbol streams have different symbol frequencies. Adaptive arithmetic coders which adjust a coding model to an input stream as input data are being coded are known in the art and will not be described further.

The context analyzer 112 of the present invention, upon sending to the arithmetic coder 116 a group of symbols comprising a run word and the LSB symbol of the following level word, issues a select context command 1102 to the arithmetic coder 116. The select context command 1102 causes the arithmetic coder 116 to use the coding context model 1104 which it is adapting to arithmetically code groups of symbols which comprise a run word and LSB symbol.

Similarly, the context analyzer 112, upon sending to the arithmetic coder 116 a group of symbols comprising a level word with no LSB, issues a second select context command 1102 to the arithmetic coder. This second select context command 1102 causes the arithmetic coder 116 to use the context model 1106 it is adapting to code groups of symbols consisting of a level word having no LSB.

By partitioning the input symbol stream into two types of symbol groups, the invention takes advantage of the different symbol frequencies associated with each type of symbol group. The context-sensitive arithmetic coder 116 can thus achieve greater compression by coding symbols from each of the two groups using two different adaptive context models (1104, 1106). The output of the arithmetic coder 116 is a compressed bit stream 1108.

It will be appreciated by those skilled in the art that, by using differing alphabets, or by mapping different words to either run or level values, or by the combination, different partition methods exist, and the present invention is not limited by the particular partition method described in relation to FIGS. 11 and 12.

Figure 13:
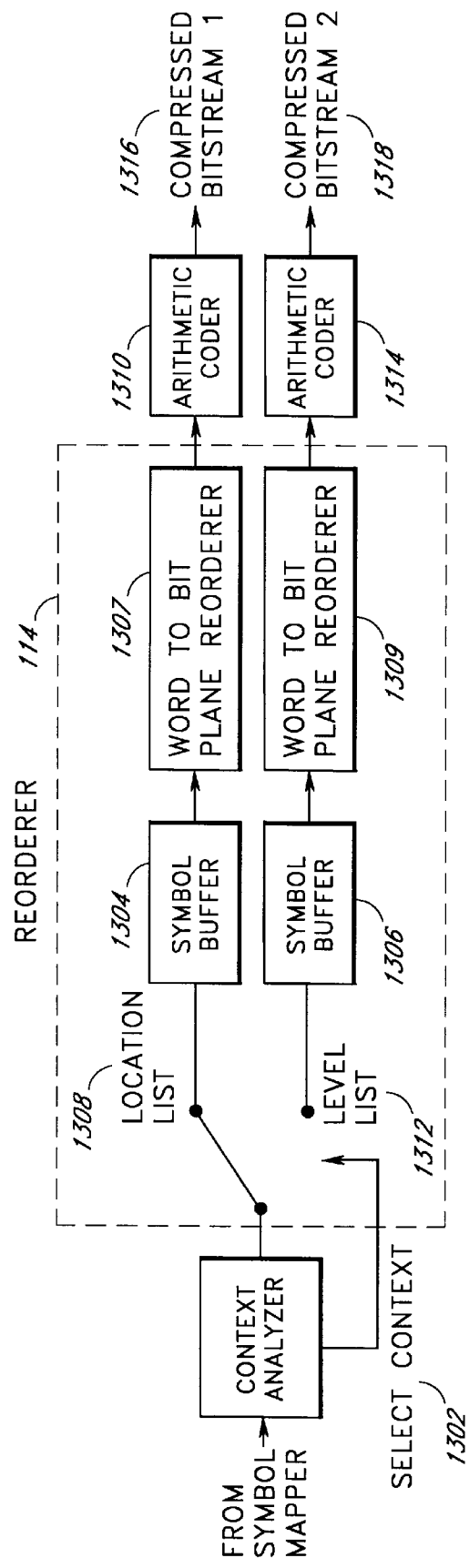
FIG. 13 is a block diagram illustrating context-oriented word-to-bit-plane reordering of symbols in a symbol stream to produce two compressed bitstreams by applying arithmetic coding.

FIG. 13 is a block diagram which illustrates a further advantageous step of reordering symbols within one of the symbol groups generated by the context analyzer 112. As described in relation to FIG. 12, the context analyzer 112 partitions an input symbol stream into groups of symbols of two different types: symbol groups of type 1 (location list 1204) always comprise a run word combined with the LSB of the following level word; and symbol groups of type 2 (level list 1206) always comprise a level word without a LSB. As shown in FIG. 13, however, the context analyzer 112 outputs partitioned symbol groups to a reorderer 114.

Upon transmitting a group of symbols from the location list 1204 to the reorderer 114, the context analyzer 112 also transmits a select context command 1302 to the reorderer 114. The select context command 1302 causes the reorderer to store this group of symbols within a symbol buffer 1304 which holds location list symbol groups. Next, the context analyzer transmits a second group of symbols, this time from the level list, to the reorderer 114. The context analyzer also transmits a select context command 1302 to the reorderer 114 which causes the reorderer 114 to store this second group of symbols within a symbol buffer 1306 which holds level list symbol groups. The context analyzer 112 continues this described interaction with the reorderer 114 until all location list symbol groups have been stored in the location list symbol buffer 1304 and all level list symbol groups have been stored in the level list symbol buffer 1306.

The reorderer 114 will then perform a word-to-bit-plane reordering of the symbols within one of the symbol groups in a reorderer 1307 or a reorderer 1308. To reverse the bit-plane reordering performed on one of the symbol groups, the ordering of symbols within the other symbol group must be preserved. Thus, bit-plane reordering can be performed on only one of the symbol groups. Generally, the larger the percentage of high data values within a symbol group, the better will be the compression improvement resulting from bit-plane reordering. Therefore, the decision as to whether bit-plane reordering should be performed on the location list symbol groups or the level list symbol groups depends, at least in part, on which groups would be expected to have a larger percentage of high data values. This, in turn, will depend on the nature of the original input data.

Figure 14A:
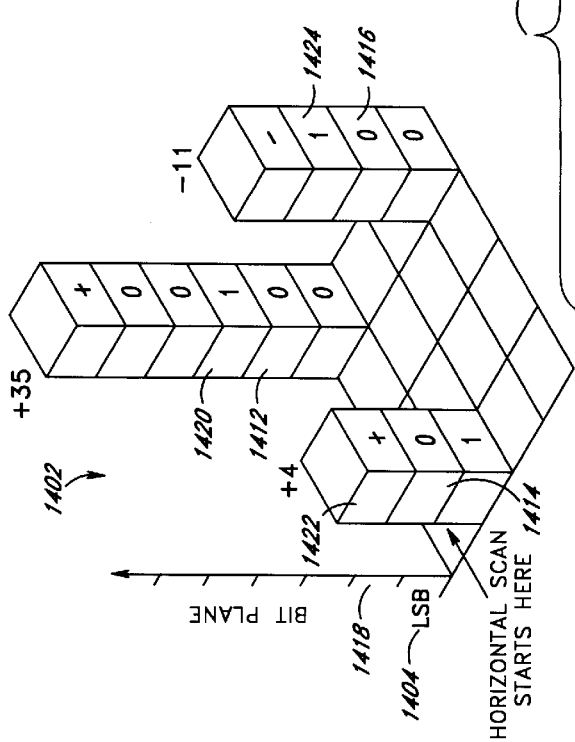
FIG. 14a illustrates a representation of three level values as level words which are positioned in a two-dimensional input array of quantized data values and whose significant digits are represented along a third bit-plane axis.
Figure 14B:
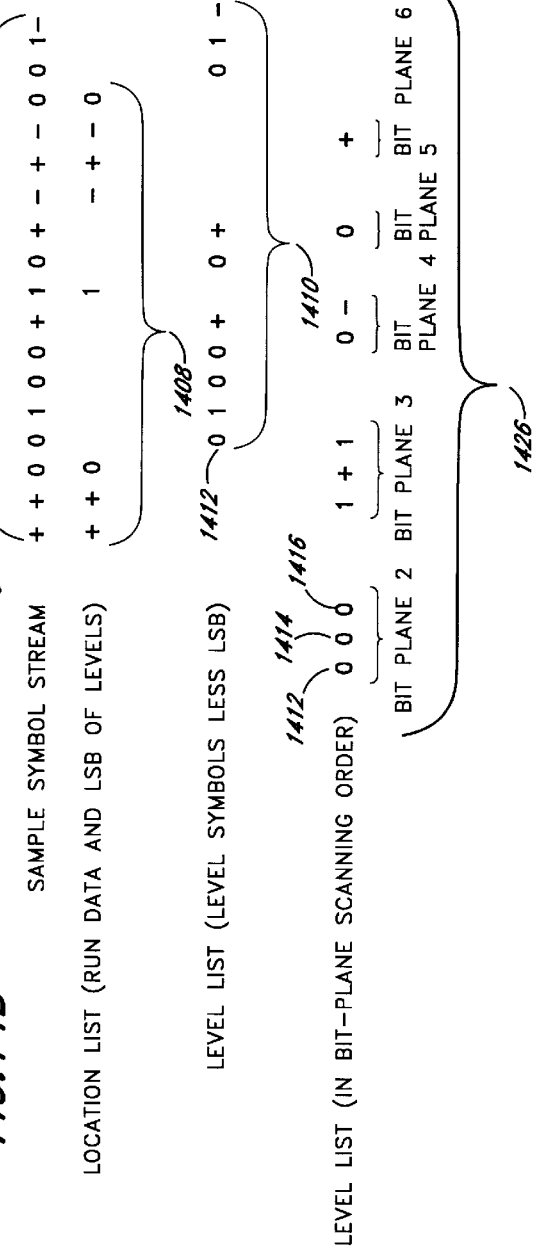
FIG. 14b illustrates an example of word-to-bit-plane reordered symbols from example symbol groups of a level list.

An example of word-to-bit-plane reordering is provided with respect to the level list symbol groups stored in the level list symbol buffer 1306. FIGS. 14*a* and 14*b* illustrate the method of word-to-bit-plane reordering. FIG. 14*a* represents a three-dimensional diagram 1402 illustrating three level words stacked vertically such that their respective least significant bit LSB symbols occupy the lowest level or first bit-plane 1404. FIG. 14*b* represents a sample symbol stream 1406 which contains the following words: "++" (run), "00100+" (level), "" (empty is run), "10+" (level), "−+−" (run), and "001−" (level). The context analyzer 112 partitions this symbol stream 1406 as described above into the symbol groups in the location list 1408 and into symbol groups in the level list 1410. Note that each symbol group in the level list 1410 is a level word without a LSB.

To perform word-to-bit-plane reordering on the level list, the reorderer 114 20 scans the level list 1410 symbol groups beginning with the first symbol of each symbol group. In the example of FIG. 14, the symbol groups of the level list 1410 are "0100+", "0+", and "01−". Thus, in scanning the first symbol of each symbol group in the level list 1410, the reorderer 114 scans each group in the order it was received from the context analyzer 112 and thus encounters "0" 1412, then "0" 1414, and then "0" 1416. The first symbols (1412, 1414, 1416) of each symbol group in the FIG. 14*b* level list 1410, occupy the second bit-plane 1418 illustrated in FIG. 14*a*. The reorderer 114 next scans the second symbol of each symbol group of the level list 1410, and encounters, in order, the symbols "1" 1420, then "+" 1422, and then "1" 1424. It will be understood that these symbols comprise the third bit-plane as illustrated in FIG. 14*a*. The "+" in the second symbol group indicates that the second symbol group contains no further symbols. The reorderer 114 next scans the third symbol of each symbol group in the level list 1410. Scanning the third symbols, the reorderer 114 encounters, in order, the symbol "0" and then "1". Note that there is no third symbol in the second symbol group of the level list 1410, and therefore the reorderer 114 simply bypasses further examination of the second symbol group. The reorderer 114 iterates through this bit-plane analysis until all symbols of all symbol groups in the level list 1410 have been scanned. The resulting bit-plane order 1426 of the symbols in the level list 1410 is "0001+10−0+".

If word-to-bit-plane reordering is performed on location list symbol groups, the reorderer 114 performs the similar steps of scanning all first position symbols from all the location list symbol groups, then all second position symbols, then all third position symbols, and so on, until all symbols were exhausted. One skilled in the art will appreciate that, if word-to-bit-plane reordering is performed on one symbol group, then symbols from the other symbol group could be input immediately to an arithmetic coder without being stored in a symbol group buffer.

Bit-plane reordering, although introducing greater complexity in the compression process, will cause further inequality in the distribution of symbols within the symbol groups being reordered, and, as discussed above, will facilitate improved compression by the later step of entropy coding. Other types of reordering are possible and the present invention is not limited to the bit-plane reordering described herein.

After word-to-bit-plane reordering is performed upon all the symbols within the location list 1408 or the level list 1410, FIG. 13 shows that the reordered symbols, if from the location list, are input to an arithmetic coder 1310, or if from the level list, are input to an arithmetic coder 1314. As discussed above, but not directly indicated on FIG. 13, the symbols not reordered are not buffered by the reorderer 114 and, if from the location list, are input to the arithmetic coder 1310, or if from the level list, are input to the arithmetic coder 1314. Because the symbols have already been stored by the reorderer 114 into different contexts before arithmetic coding, there is no need for multiple context coding by the arithmetic coders (1310, 1314) of FIG. 13. The arithmetic coders 1310 and 1314 are preferably adaptive arithmetic coders as described above, and each will produce a compressed bit stream (1316, 1318). The two compressed bit streams (1316, 1318), considered together, can be expected to be smaller than the single compressed bit stream 1108 of FIG. 11. This improvement in compression is attributable to the efficiency in arithmetic coding gained from word-to-bit-plane reordering performed on the symbols of either the location list or the level list.

Figure 15:
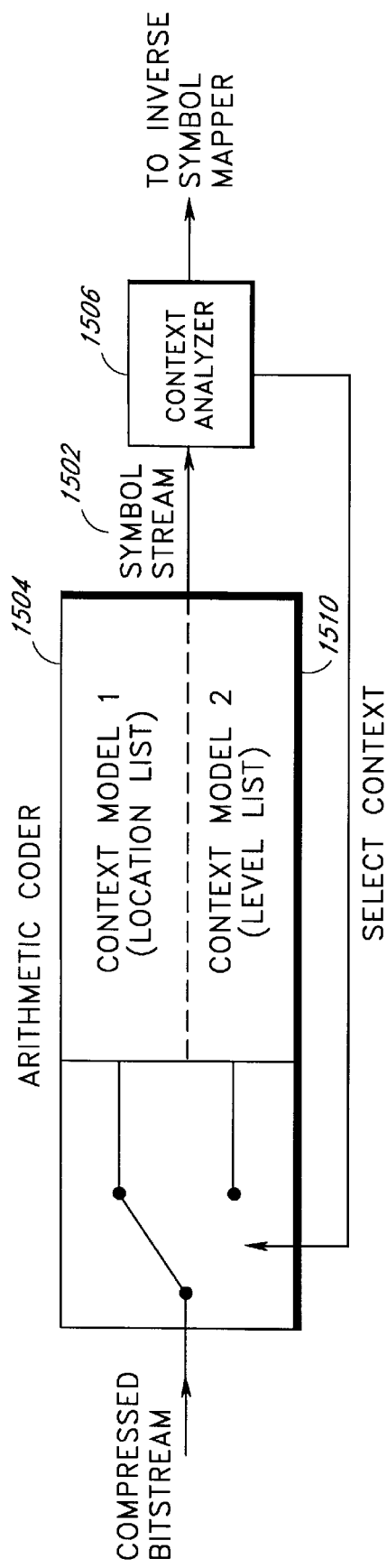
FIG. 15 is a block diagram illustrating context-oriented arithmetic decoding of a compressed bitstream to produce a stream of symbols.

FIG. 15 is a block diagram which illustrates the steps of inputting compressed bitstream data 1108 to the arithmetic decoder 204 and decoding the bitstream data 1108 into a symbol stream 1502 that is eventually input to an inverse symbol mapper. The arithmetic decoder 204 is capable of decoding the input bitstream 1108 using two different contexts, and is thereby capable of decoding the bitstream 1108 produced by the arithmetic coder 116 described in relation to FIG. 11. The arithmetic decoder 204 is initialized to decode bitstream data using a first context model 1504 appropriate for decoding bitstream data which represent symbols comprising symbol groups from a location list 1204 (groups of symbols comprising a run word and a LSB symbol from a following level word). Thus, when the compressed bitstream 1108 is input to the arithmetic decoder 204, the arithmetic decoder 204 outputs a symbol stream 1502 containing symbols from a location list 1204 symbol group. As the symbols 1502 are output one-by-one by the arithmetic decoder 204, these symbols are input to the context analyzer 1506. The context analyzer 1506 examines the input symbols 1502 one-by-one.

As the context analyzer 1506 examines the first few input symbols, it detects the termination of a location list 1204 symbol group, and then issues a select context command 1208 to the arithmetic decoder 204. The arithmetic decoder 204 then uses a context model 1510 appropriate to decode bitstream data representing a symbol group from a level list 1206. The arithmetic decoder 204 then begins to output symbols representing a level list 1206 symbol group. When the context analyzer 1506 recognizes the termination of a level list 1206 symbol group, it issues a select context command 1208 to the arithmetic decoder 204 to cause the arithmetic decoder 204 to again alter the context model used to decode the bitstream data 1108. Thus, the context analyzer 1506 controls the context of arithmetic decoding until the bitstream input to the arithmetic decoder 204 is exhausted. The context analyzer 1506 outputs the symbol stream 1504 unaltered for input to an inverse symbol mapper.

As there are other ways of partitioning symbols, especially when alternative alphabets or alternative word to value mappings are used by a symbol mapper, those skilled in the art will appreciate that there are other methods of recognizing context changes, and the present invention is not limited to the context recognition described in relation to FIG. 15.

Figure 16:
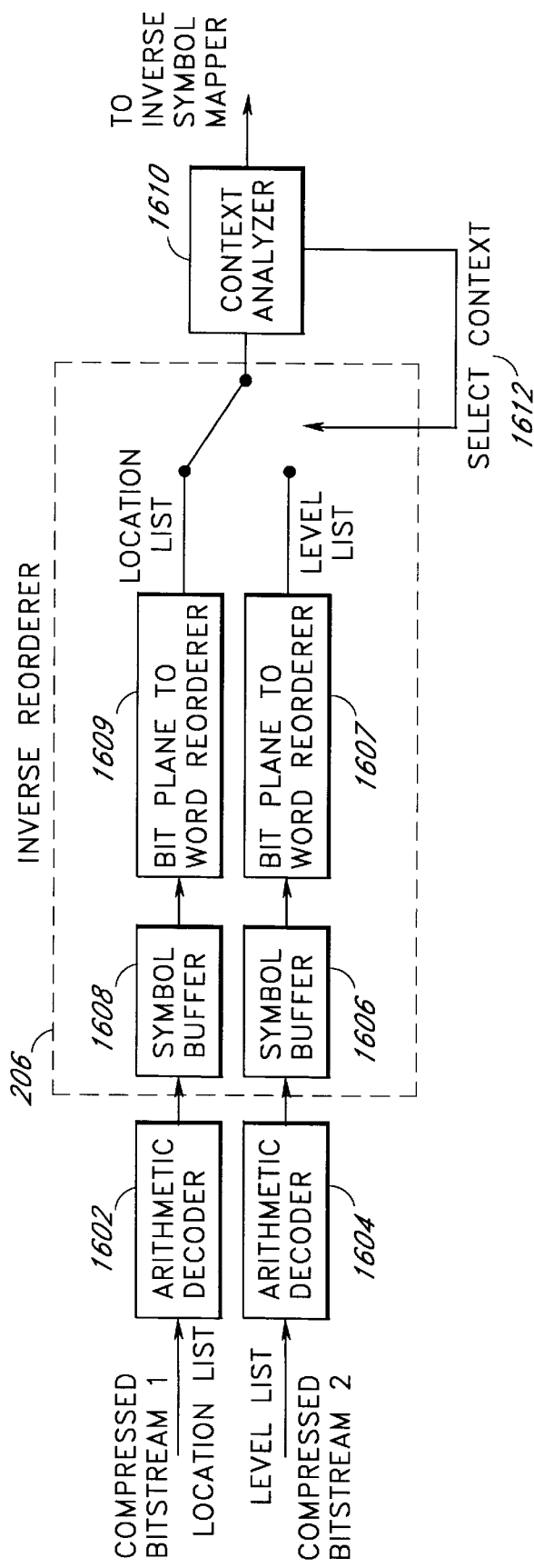
FIG. 16 is a block diagram illustrating arithmetic decoding of two compressed bitstreams to produce two symbol streams and context-oriented bit-plane-to-word reordering of symbols to produce one output symbol stream.

FIG. 16 is a block diagram illustrating arithmetic decoding of two bitstreams such as those produced using the steps described in relation to FIG. 13 is of separating the location list 1308 symbol groups from the level list 1312 symbol groups, performing word-to-bit-plane reordering on one of the separated symbol groups, and then arithmetically coding both the reordered symbol group and the non-reordered symbol group. In keeping with the example of FIG. 13, one bitstream 1316 will represent symbols from the compressed location list 1308, and the other bitstream 1318 will represent symbols from the compressed level list 1312 which have also been word-to-bit-plane reordered. The location list bitstream 1316 is input to a first arithmetic decoder 1602, and the level list bitstream is input to a second arithmetic decoder 1604 which could be identical to the first arithmetic decoder 1602.

Because the data of each bitstream (1316, 1318) represent only one context, the arithmetic decoders (1602, 1604) need not be capable of decoding in multiple context models. The arithmetic decoder 1602 outputs a sequence of symbols representing symbols in the location list 1308, and the arithmetic decoder 1604 outputs symbols representing symbols in the level list 1312 which have been word-to-bit-plane reordered.

The reordered level list 1312 symbol group data output from the arithmetic decoder 1604 are input to an inverse reorderer 206. The inverse reorderer 206 stores all the reordered level list symbol group data in a level list symbol buffer 1606. To reverse the word-to-bit-plane reordering performed on the level list data, the inverse reorderer must interrogate the nonreordered location list data. Therefore, the nonreordered location list data should also be buffered in the location list symbol buffer 1608. When both location list and reordered level list data are stored in respective symbol buffers, the inverse reorderer 206 will reverse the word-to-bit-plane reordering performed on the level list symbols in a bit-plane-to-word reorderer 1607. A bit-plane-to-word reorderer 1609 is provided if word-to-bit-plane reordering was originally performed on the location list instead of the level list.

The location list data, being preserved in the form of symbol groups, each comprising a full run word as well as the LSB symbol of the following level word, provide sufficient information to the inverse reorderer 206 to reconstruct the original level word symbol groups. The count of LSB symbols identified in the location list indicates precisely the number of level word symbol groups that must be reconstructed. The inverse reorderer 206 creates one empty string variable for each of the necessary number of level words.

The inverse reorderer then places the first symbol from the reordered level list data into the first position of the first string variable, the second symbol into the first position of the second string variable, and so on, until all string variables have one symbol. Then the inverse reorderer places the next symbol into the second position of the first string variable, then places the next symbol into the second position of the second string variable, and so on, again, until all string variables have two symbols. Note that when either a "+" or a "−" symbol (the terminating MSB symbol of any level list symbol group) is placed in a string variable, such string variable represents a completed level list symbol group and the inverse reorderer 206 will place no firer symbols in that string variable. The inverse reorderer proceeds in this manner until all symbols from the reordered level list data are exhausted and, at that time, all original symbol groups of the level list will have been reconstructed.

One skilled in the art will appreciate that this reconstruction could be performed a number of ways and the inverse reorderer 206 of the present invention is not limited to the reconstruction method discussed above. It will be similarly appreciated that when location list symbols are reordered, such reordering can be reversed by interrogating level list symbol groups which have been preserved in their original order.

After the level list symbol groups are reconstructed, the inverse reorderer will begin to output symbols starting first with symbols from the location list. As the symbols are generated by the inverse reorderer 206, they are input into a context analyzer 1610. The context analyzer 1610 examines the symbols and, upon detecting the termination of a location list symbol group, issues a select context command 1612 to the inverse reorderer 206. The select context command 1612 is causes the inverse reorderer 206 to output symbols from the level list symbol group. As these symbols are output, they are immediately input to the context analyzer 1610, which, upon determining the termination of a level list symbol group, issues a select context command 1612 to the inverse reorderer 206. The inverse reorderer 206 then responds by outputting symbols from the location list. The context analyzer 1610 proceeds to control the output of symbols by the inverse reorderer 206 until all symbols from both the location list and the level list have been output by the inverse reorderer 206. The context analyzer outputs the symbols, performing no partitioning, as a symbol stream which is input to the inverse symbol mapper 210.

Figure 17:
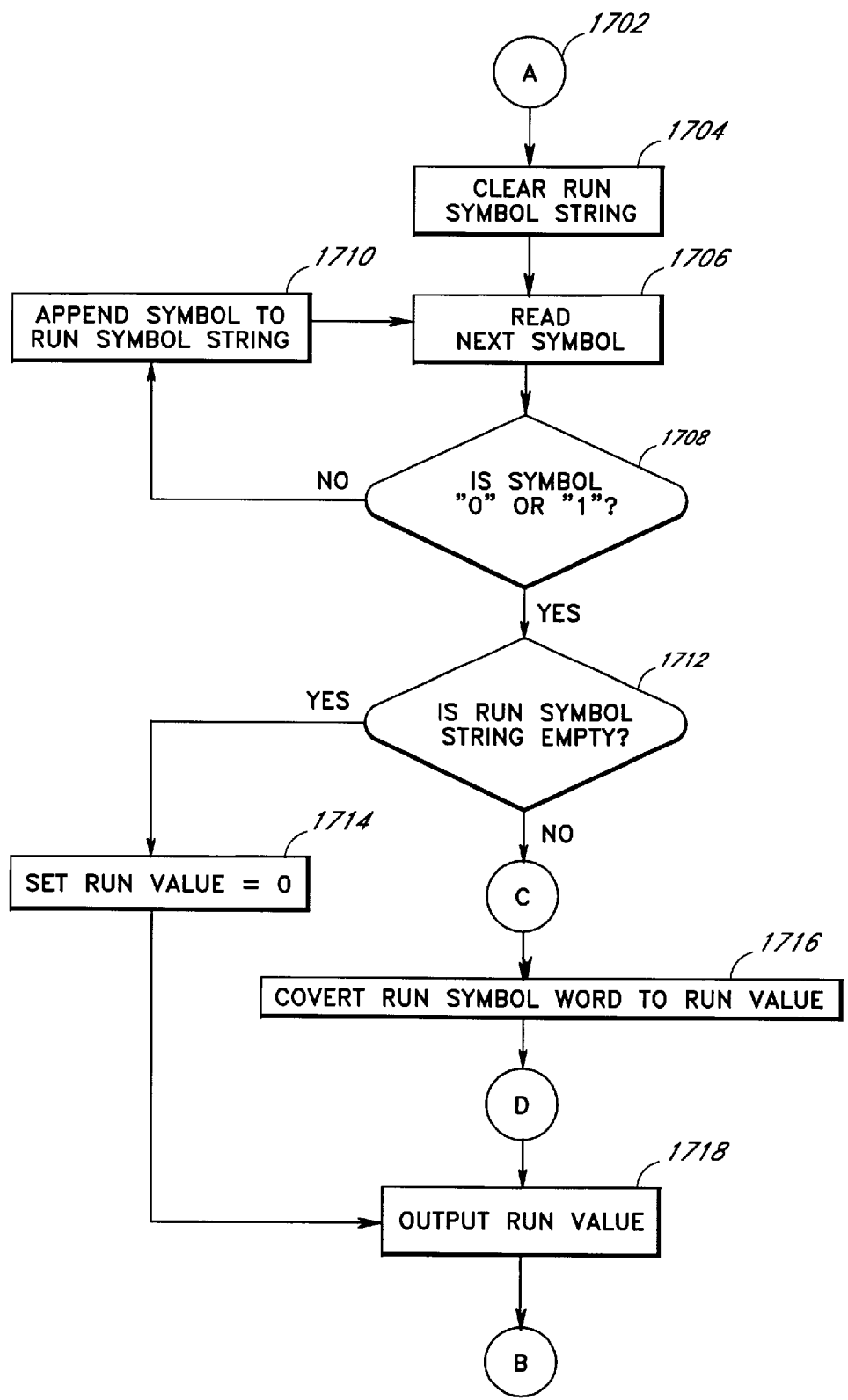
FIG. 17 is a flowchart representing steps to map input run words into output

FIG. 17 is a flowchart which illustrates the steps performed by the inverse symbol mapper 210. The inverse symbol mapper 210 inputs a stream of symbols and outputs run/level coded integers. The inverse symbol mapper 210 first clears a run string variable in a step 1704. Next, in a step 1706, the inverse symbol mapper 210 reads the first (next) input symbol expected to be part of a run word. In a step 1708, the symbol mapper 210 determines whether the symbol is a "1" or which would mark the end of a run word. If the symbol is not a "1" or a "0", the inverse symbol mapper 210 appends the symbol to the run symbol string in a step 1710. If the symbol is a "1" or "0", meaning that the beginning of a level word has been detected, then, in a step 1712, the inverse symbol mapper 210 checks to see whether the run symbol string is empty (which is the case whenever no zeros precede the level value in the data prior to run/level coding). If the run symbol string is empty, then the inverse symbol mapper 210 sets a run value variable to 0 in a step 1714. If the run symbol string is not empty, the inverse symbol mapper 210 looks up the run symbol string in a symbol map 502 in a step 1716, and sets the run value variable to the run value associated with the run symbol string by the symbol map. The inverse symbol mapper 210 then outputs whatever integer the run value has been assigned in a step 1718.

Figure 18:
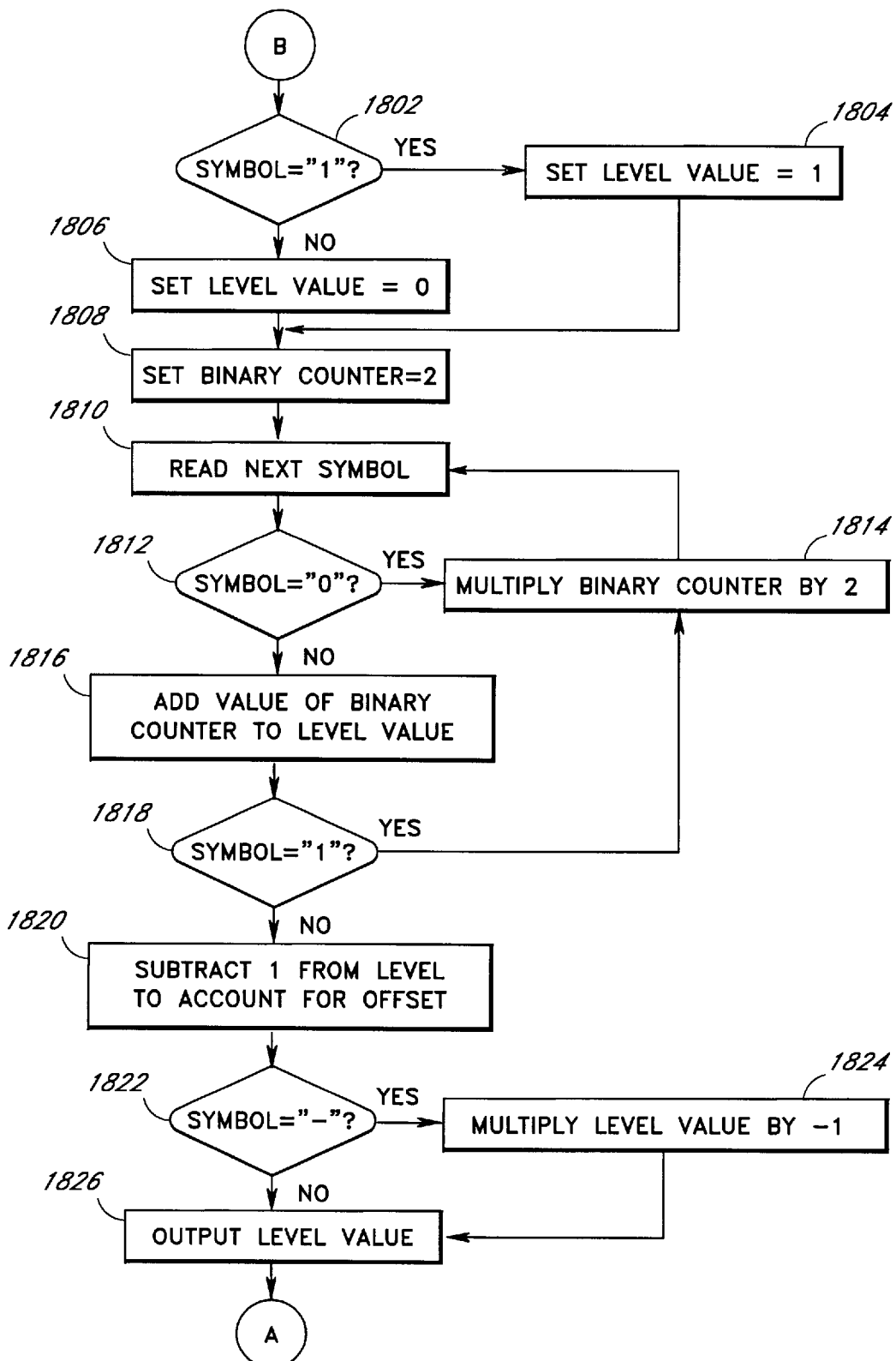
FIG. 18 is a flowchart representing steps to map input level words into output level values.

FIG. 18 is a continuation flowchart which illustrates the steps performed by the inverse symbol mapper 210 immediately following the steps illustrated by is FIG. 17. The steps illustrated by the flowchart of FIG. 18 indicate one method an inverse symbol mapper 210 can use to formulating a level value integer. With the first symbol of the level word already input, the inverse symbol mapper 210 checks whether the symbol is "1" in a step 1802. If so, a level value variable is set to 1 in a step 1804, otherwise the level value variable is set to 0 in a step 1806. Next the inverse symbol mapper 210 sets a binary counter variable to 2 in a step 1808. The inverse symbol mapper 210 then reads the next symbol of input (hereafter the present symbol) in a step 1810 and checks whether it is a "0" in a step 1812. If the present symbol is a "0", then the binary counter is multiplied by 2 in a step 1814 whereupon the inverse symbol mapper 210 reads the next symbol in the step 1810. If, however, the present symbol is not "0", the value of the binary counter is added to the level value variable in a step 1816. If the present symbol is a "1" in a step 1818, then the binary counter is multiplied by 2 in a step 1814 and the inverse symbol mapper 210 proceeds to read the next symbol in a step 1810. If the present symbol is not "1", then one is subtracted from the level value variable to account for the offset in a step 1820. The inverse symbol mapper 210 then checks to see if the present symbol is "−" in a step 1822, and, if so, the level value variable is multiplied by −1 in a step 1824 to make it negative. The inverse symbol mapper 210 then outputs the level value in a step 1826. Control then resumes in the run value context 1702 with the next step 1704 of clearing the run symbol string. The inverse symbol mapper 210 thus iterates through the steps described in FIGS. 17 and 18 until the input symbol stream is exhausted.

As described above, a symbol mapper may use logical steps rather than a symbol map to construct words to represent run values. Likewise, an inverse symbol map may use logical steps to construct run values from input run word symbols. The steps illustrated in the flowchart of FIG. 19 are designed to replace the step 1716 of converting a run symbol word to a run value illustrated by FIG. 17.

Figure 19:
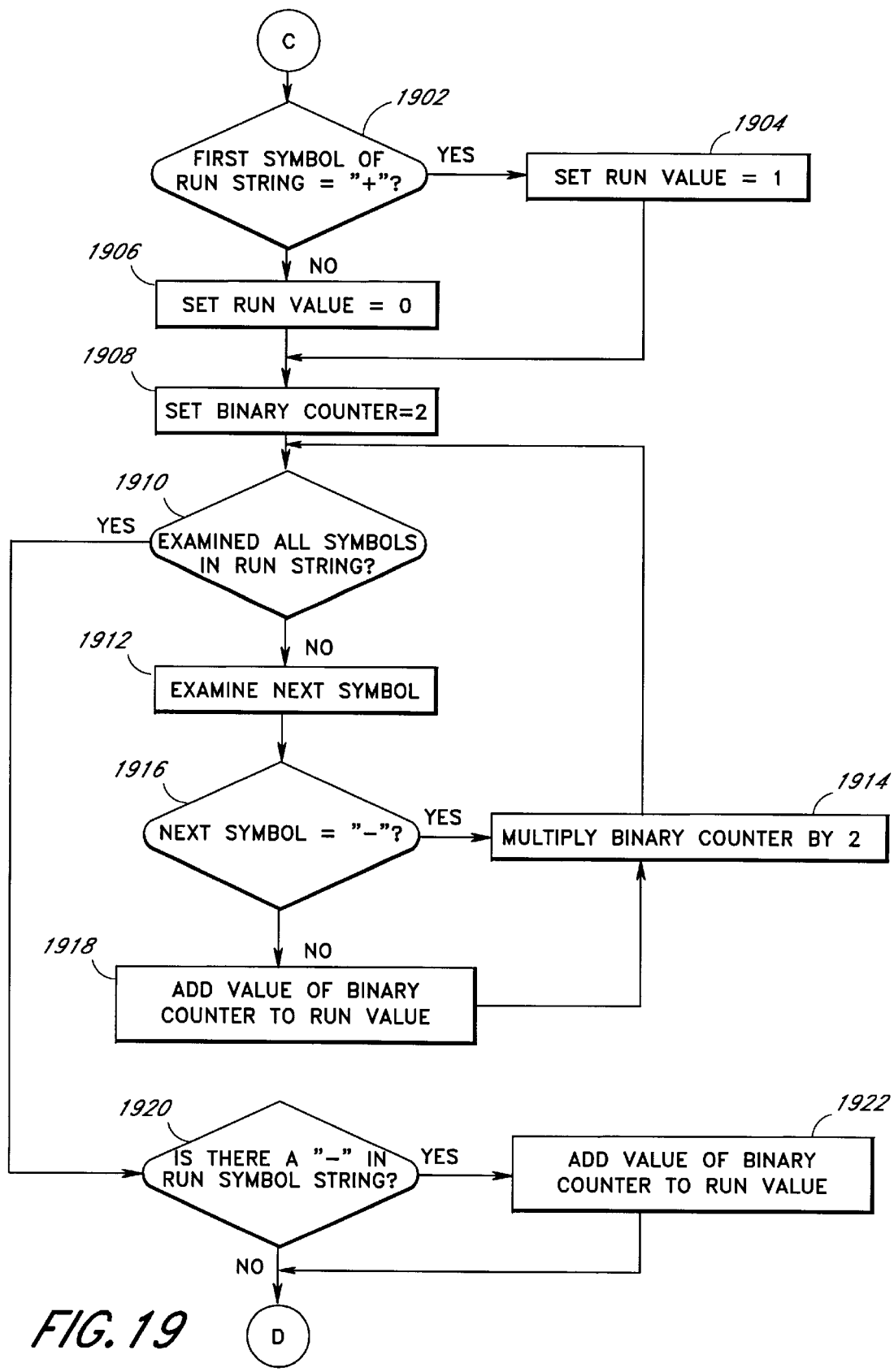
FIG. 19 is a flowchart representing steps to map a run word to a run value.

One skilled in the art will understand that at the time of the first step of FIG. 19, a non-empty run symbol string will have been created by prior steps of the inverse symbol mapper 210. Accordingly, the first step to construct a run value from symbols in a run word is to check whether the first symbol in the run symbol string is "+" in a step 1902. If so, the inverse symbol mapper 210 sets a run value variable to 1 in a step 1904, otherwise the run value variable is set to 0 in a step 1906. Next, in a step 1908, the inverse symbol mapper 210 sets a binary counter to 2. The inverse symbol mapper 210 then iterates through a loop which examines the symbols 1910 of the run symbol string in sequence. If, in a step 1910, there are symbols unexamined in the run symbol string, the inverse symbol mapper 210 examines the next symbol in a step 1912. If, in a step 1916, the examined symbol is "−", the inverse symbol mapper 210 multiplies the binary counter by 2 in a step 1914 and again checks for additional symbols in the step 1910. If, however, the examined symbol is "+", then the value of the binary counter is added to the run value variable in a step 1918 before multiplying the binary counter by 2 in the step 1914 and again checking for additional symbols in the step 1910. When all symbols in the run symbol string have been examined, the inverse symbol mapper 210 checks to see whether any of the symbols in the run symbol string are "−" in a step 1920. If not, the value of the run value variable is output in the step 1718 (FIG. 17). If any of the symbols in the run symbol string are "−", then the value of the binary counter is added to the run value variable in a step 1922 whereupon the value of the run value variable is output in the step 1718 (FIG. 17).

The inverse symbol mapper described above outputs run/level coded integers. Run level decoding is known and will not be further described.

FIGS. 20a–20e illustrate how the present invention can be applied to a sequence of digitally-represented floating point numbers. A set of floating point numbers are represented using scientific notation 2002, whereby each number comprises a mantissa 2004, which specifies a value within a range typically bounded by −1 and 1, and an exponent 2006, which specifies the power of 10 by which the mantissa is multiplied. An example of a list of several such numbers is shown in FIG. 20a. It is possible for the mantissa, the exponent, or both to be zero.

The exponent is already in integer format and does not need to be further quantized. The mantissa is also in effect quantized because it is expressed in a digital representation as a binary word with a fixed maximum length. FIG. 20b illustrates the example where the binary word is limited to 24 bits in length. Since one of the bits of the word in most digital representations is reserved for the sign of the mantissa, 23 bits in this example are reserved for the value. Each mantissa, then, is converted from a fractional value in the range −1 to 1 to an integer value. The result is a representation of each floating point number as a pair of integers as shown in FIG. 20c. The sequence of steps in FIGS. 20a, 20b, and 20c is well known in the art and is described here only to clarify FIGS. 20d and 20e.

FIG. 20d shows one way in which the integer pairs in FIG. 20c could be expressed as run/level pairs appropriate for input to the symbol mapper 110. In FIG. 20d, scanning is performed first vertically down the list of quantized mantissas, and then down the list of exponents. Since most of the mantissa and exponent values are nonzero in this example, most of the run values in FIG. 20d are zero. FIG. 20e illustrates another mapping of the integers described in FIG. 20c. In FIG. 20e, the scanning is performed in a horizontal manner.

This invention may be embodied in other specific forms without departing from the essential characteristics as described herein. The embodiments described above are to be considered in all respects as illustrative only and not restrictive in any manner. The scope of the invention is indicated by the following claims rather than by the foregoing description. Any and all changes which come within the meaning and range of equivalency of the claims are to be considered within their scope.

We claim:

1. A method of representing a stream of signed data values, wherein the number of significant digits representing said signed data values varies, said method comprising the steps of:

representing the most significant digit of each signed data value with a symbol from a first symbol set, said symbol representing a value of said most significant digit and the sign of the respective signed data value, said value of said most significant digit representing more than half of the absolute value of said sinned data value; and representing each significant digit other than said most significant digit of each signed data value with a symbol from a second symbol set.

2. A method of representing a stream of signed and unsigned values, wherein the number of significant digits representing each of said values varies, said method comprising the steps of:

representing the most significant digit of each signed value with a symbol from a first symbol set;

representing each significant digit other than said most significant digit of each signed value with a symbol from a second symbol set; and representing each digit of each unsigned value with a symbol from said first symbol set.

3. A method for reducing the number of values representing sequential groups of signed data values, wherein said groups comprise a fixed number of said data values, and wherein said fixed number is at least one, said method comprising the steps of:

assigning a sequence of symbols to a first of said data values, each of said symbols representing a significant digit, each of said symbols belonging to a first symbol set, said sequence of symbols uniquely identifying the absolute value of said first data value; and mapping a symbol representing a most significant digit in said sequence of symbols to a sign symbol from a second symbol set, said sign symbol representing the most significant digit in said sequence and also representing the sign of said first data value, said second symbol set comprising at least two symbols different from the symbols of said first symbol set.

4. The method as defined in claim 3, wherein each of said symbols comprising said sequence represents a significant binary digit, and wherein said sign symbol represents a most significant binary digit.

5. The method as defined in claim 4 wherein said first data value is a member of a first of said groups and said sequence is a first sequence, said method comprising the further step of:

assigning a second sequence of symbols to a second of said data values of said first group, said symbols of said second sequence representing significant binary digits and belonging to said second symbol set, said second sequence uniquely identifying said second data value.

6. The method as defined in claim 5, wherein said second sequence of symbols uniquely identifies the absolute value of said second data value, said method comprising the further step of:

mapping a symbol representing a most significant binary digit of said second sequence to a second sign symbol, said second sign symbol representing the most significant binary digit of said second sequence and also representing the sign of said second data value, said second sign symbol belonging to a third symbol set comprising at least two symbols different from the symbols of said second symbol set.

7. The method as defined in claim 6, wherein said second sign symbol belongs to said first symbol set.

8. The method as defined in claim 3, wherein said first data value is a member of a first of said groups and said sequence is a first sequence, said method comprising the further step of:

assigning a second sequence of symbols to a second of said data values of said first group, said symbols of said second sequence representing significant digits and belonging to said second symbol set, said second sequence uniquely identifying said second data value.

9. The method as defined in claim 8, wherein said second sequence of symbols uniquely identifies the absolute value of said second date value, said method comprising the further step of:

mapping a symbol representing a most significant digit of said second sequence to a second sign symbol, said second sign symbol representing the most significant digit of said second sequence and also representing the sign of said second data value, said second sign symbol belonging to a third symbol set comprising at least two symbols different from the symbols of said second symbol set.

10. The method as defined in claim 9, wherein said second sign symbol belongs to said first symbol set.

11. The method as defined in claim 10, wherein each of said symbols comprising said first sequence and said second sequence represents a significant binary digit, and wherein said sign symbol and said second sign symbol represent most significant binary digits.

12. A method for generating a reduced number of values to represent sequential groups of data values and for partitioning data represented by said reduced number of values, wherein each of said groups includes at least one unsigned data value and one signed data value, said method comprising the steps of:

assigning a first sequence of symbols to a first of said unsigned data values belonging to a first of said groups, each of said symbols representing a significant digit, each of said symbols belonging to a first symbol set, said first sequence of symbols uniquely identifying the value of said first unsigned data value;

assigning a second sequence of at least two symbols to a first of said signed data values belonging to said first group, each of said symbols representing a significant digit, each of said symbols belonging to a second symbol set and not belonging to said first symbol set, said sequence of symbols uniquely identifying the absolute value of said first data value, said second symbol set including at least two symbols different from said first symbol set;

mapping a symbol representing a most significant digit in said second sequence of symbols to a sign symbol comprising a symbol from said first symbol set, said sign symbol representing the most significant digit in said second sequence and also representing the sign of said first signed data value; and generating first and second partitioned symbol groups by:
removing a least significant symbol representing a least significant bit from said second sequence of symbols to produce said second partitioned symbol group comprising symbols remaining in said second sequence after said removal; and appending said least significant symbol removed from said second sequence of symbols to said first sequence of symbols to produce said first partitioned symbol group comprising said first sequence of symbols and said least significant symbol, said least significant symbol positioned after any symbols representing any bits of said first sequence of symbols.

13. The method as defined in claim 12 wherein said first sequence of symbols is empty and has no symbols, said removed least significant symbol comprising the only symbol in said first partitioned symbol group.

* * * * *

UNITED STATES PATENT AND TRADEMARK OFFICE
CERTIFICATE OF CORRECTION

PATENT NO. : 5,818,877
DATED : October 6, 1998
INVENTOR(S) : Min-Jen Tsai, et al.

It is certified that error appears in the above-identified patent and that said Letters Patent is hereby corrected as shown below:

Column 22,
Line 48, change "said sinned" to -- said signed --.

Column 23,
Line 54, change "date value" to -- data value --.

Signed and Sealed this

Sixth Day of November, 2001

Attest:

*Nicholas P. Godici*

NICHOLAS P. GODICI
*Attesting Officer*      *Acting Director of the United States Patent and Trademark Office*